(12) United States Patent
Kasai et al.

(10) Patent No.: US 7,943,413 B2
(45) Date of Patent: May 17, 2011

(54) VIBRATION SENSOR AND METHOD FOR MANUFACTURING THE VIBRATION SENSOR

(75) Inventors: Takashi Kasai, Kyoto (JP); Yasuhiro Horimoto, Kyoto (JP); Fumihito Kato, Kyoto (JP); Masaki Munechika, Kyoto (JP); Shuichi Wakabayashi, Kyoto (JP); Toshiyuki Takahashi, Kyoto (JP); Masayuki Inuga, Kyoto (JP)

(73) Assignee: OMRON Corporation, Kyoto (JP)

( * ) Notice: Subject to any disclaimer, the term of this patent is extended or adjusted under 35 U.S.C. 154(b) by 127 days.

(21) Appl. No.: 12/440,127

(22) PCT Filed: Jul. 20, 2007

(86) PCT No.: PCT/JP2007/064368
§ 371 (c)(1),
(2), (4) Date: May 6, 2009

(87) PCT Pub. No.: WO2008/044381
PCT Pub. Date: Apr. 17, 2008

(65) Prior Publication Data
US 2010/0038734 A1 Feb. 18, 2010

(30) Foreign Application Priority Data
Oct. 13, 2006 (JP) .................. 2006-280648

(51) Int. Cl.
*H01L 29/84* (2006.01)
*H01L 21/28* (2006.01)
(52) U.S. Cl. .................. 438/53; 257/416; 257/E21.158; 257/E29.324; 438/50
(58) Field of Classification Search .................. 257/416; 438/53
See application file for complete search history.

(56) References Cited

U.S. PATENT DOCUMENTS
4,784,721 A * 11/1988 Holmen et al. .................. 216/2
(Continued)

FOREIGN PATENT DOCUMENTS
JP 01-309384 A 12/1989
(Continued)

OTHER PUBLICATIONS
International Search Report w/translation from PCT/JP2007/064368 dated Oct. 23, 2007 (4 pages).
(Continued)

*Primary Examiner* — N Drew Richards
*Assistant Examiner* — Robert Carpenter
(74) *Attorney, Agent, or Firm* — Osha • Liang LLP

(57) ABSTRACT

A method for manufacturing a vibration sensor including forming a sacrifice layer at one part of a front surface of a semiconductor substrate of monocrystalline silicon with a material isotropically etched by an etchant for etching the semiconductor substrate, forming a thin film protective film with a material having resistance to the etchant on the sacrifice layer and the front surface of the semiconductor substrate at a periphery of the sacrifice layer, forming a thin film of monocrystalline silicon, polycrystalline silicon, or amorphous silicon on an upper side of the sacrifice layer, opening a backside etching window in a back surface protective film having resistance to the etchant for etching the semiconductor substrate formed on a back surface of the semiconductor substrate, forming a through-hole in the semiconductor substrate by etching the semiconductor substrate anisotropically by using crystal-oriented etching by applying the etchant from the back surface window, then etching the sacrifice layer isotropically by the etchant after the etchant reaches the front surface of the semiconductor substrate, and then etching the semiconductor substrate anisotropically by using crystal-oriented etching from a front side by the etchant spread to a space formed after the sacrifice layer is removed, and forming a holder for supporting the thin film on an upper surface of the semiconductor substrate by removing the thin film protective film partially.

13 Claims, 21 Drawing Sheets

U.S. PATENT DOCUMENTS

| | | | |
|---|---|---|---|
| 5,295,395 A * | 3/1994 | Hocker et al. | 73/721 |
| 5,332,469 A * | 7/1994 | Mastrangelo | 216/2 |
| 5,335,210 A * | 8/1994 | Bernstein | 367/163 |
| 5,438,875 A * | 8/1995 | Fung et al. | 73/721 |
| 5,672,551 A * | 9/1997 | Fung | 438/53 |
| 5,683,594 A * | 11/1997 | Hocker et al. | 438/53 |
| 5,684,324 A * | 11/1997 | Bernstein | 257/415 |
| 6,012,335 A * | 1/2000 | Bashir et al. | 73/724 |
| 6,426,239 B1 * | 7/2002 | Gogoi et al. | 438/53 |
| 2007/0261910 A1 * | 11/2007 | Kasai et al. | 181/142 |

FOREIGN PATENT DOCUMENTS

| | | |
|---|---|---|
| JP | 09-113390 A | 5/1997 |
| JP | 10-181032 A | 7/1998 |
| JP | 2001-519915 A | 10/2001 |
| JP | 2002-328117 A | 11/2002 |
| JP | 2003-530717 A | 10/2003 |
| JP | 2004-506394 A | 2/2004 |
| JP | 2004-356708 A | 12/2004 |
| JP | 2006-157863 A | 6/2006 |
| WO | WO 2006049100 A1 * | 5/2006 |

OTHER PUBLICATIONS

Patent Abstracts of Japan; Publication No. 01-309384 dated Dec. 13, 1989; Honeywell Inc. (1 page).

* cited by examiner (a)

(b)

(a)

(b)

(a)

(b)

(c)

VIBRATION SENSOR AND METHOD FOR MANUFACTURING THE VIBRATION SENSOR

TECHNICAL FIELD

The present invention relates to a vibration sensor and a method for manufacturing the same, in particular, to a vibration sensor including a thin film such as a diaphragm and a method for manufacturing the same.

BACKGROUND ART

A vibration sensor in which a thin film is formed by stacking layers of monocrystalline silicon or polycrystalline silicon on a silicon substrate, and the thin film is used as a diaphragm, is being developed by applying a semiconductor integrated circuit manufacturing technique. The diaphragm made of silicon has a small internal stress and a low density compared to metal such as aluminum and titanium, and thus a vibration sensor of high sensitivity can be obtained and compliance with a semiconductor integrated circuit manufacturing step is also satisfactory. The vibration sensor including such a diaphragm includes a capacitor microphone disclosed in Patent Document 1. In such a capacitor microphone, a diaphragm (movable electrode) and a fixed electrode are formed on a front surface of a semiconductor substrate of a monocrystalline silicon (100) plane, and thereafter, an etching mask is formed at the outer peripheral part of a back surface of the relevant semiconductor substrate, and the semiconductor substrate is etched from the back side until reaching the front surface thereby forming a through-hole at a central part of the semiconductor substrate. As a result, the diaphragm has a periphery fixed to the front surface of the semiconductor substrate and the central part supported in a hollow state above the through-hole, and thus can be vibrated by audio vibration and the like.

However, in the capacitor microphone of such a structure, an inclined surface from a (111) plane appears at the inner peripheral surface of the through-hole since the (100) plane semiconductor substrate is subjected to crystal anisotropic etching from the back side, and the through-hole becomes a space of a truncated pyramid shape opened large to the back side. Thus, the opening area at the back side of the through-hole becomes large compared to the area of the diaphragm, and miniaturization of the capacitor microphone is difficult. If the thickness of the semiconductor substrate is reduced, the ratio of the opening area of the back surface with respect to the opening area of the front surface of the through-hole can be reduced, but the strength of the semiconductor substrate lowers and handling at the time of manufacturing becomes difficult, and thus reducing the thickness of the semiconductor substrate has limits.

In a film-type sensor described in Patent Document 2, a through-hole is opened in the semiconductor substrate from the back side by vertical etching such as a so-called DRIE (Deep Reactive Ion Etching) and ICP (Inductively Coupled Plasma). Therefore, the film-type sensor can be miniaturized by an amount the through-hole does not spread in the truncated pyramid shape. However, in devices of DRIE, ICP, and the like, a price of the device is high and processing of a wafer is in sheet form, and thus productivity is not satisfactory.

A method for performing crystal anisotropic etching on the semiconductor substrate from the front side (diaphragm side) is also known, but in such a method, an etching hole needs to be opened in the diaphragm, which etching hole sometimes adversely affects vibration characteristics, strength, and the like of the diaphragm.

An etching method for forming a through-hole in the substrate by performing crystal anisotropic etching on the (100) plane semiconductor substrate from the back side, and reducing the ratio of the opening area of the back surface with respect to the opening area of the front surface includes a method described in Patent Document 3. In such a method, a sacrifice layer is first formed in a rectangular region to be opened on the front surface of the silicon wafer or the semiconductor substrate, and a thin film of silicon nitride is vapor deposited thereon, and thus the opening area of the back surface of the silicon wafer merely needs to be a size the through-hole can reach the sacrifice layer by anisotropic etching.

However, in this etching method, the thin film is exposed to an etchant of the substrate when etching the substrate of after the sacrifice layer of the front surface is etched, and thus monocrystalline silicon and polycrystalline silicon cannot be used for the material of the thin film. Furthermore, since the thin film is directly formed on the substrate, steps and structures for enhancing the characteristics of the vibration sensor such as stress control of the thin film and vent hole become difficult to incorporate. Therefore, the etching method disclosed in Patent Document 3 is not suitable for the method for manufacturing the vibration sensor requiring high sensitivity such as microphone.

Patent Document 1: Japanese Unexamined Patent Publication No. 2004-506394
Patent Document 2: Japanese Unexamined Patent Publication No. 2003-530717
Patent Document 3: Japanese Unexamined Patent Publication No. 1-309384

DISCLOSURE OF THE INVENTION

Problems to be Solved by the Invention

In view of the technical problems described above, it is an object of the present invention to provide a vibration sensor that is small, has high productivity, and excels in vibration characteristic, and a method for manufacturing the same.

Means for Solving the Problems

A method for manufacturing a first vibration sensor of the present invention includes the steps of: forming, at one part of a front surface of a semiconductor substrate of monocrystalline silicon, a sacrifice layer with a material isotropically etched by an etchant for etching the semiconductor substrate; forming a thin film protective film with a material having resistance to the etchant on the sacrifice layer and the front surface of the semiconductor substrate at a periphery of the sacrifice layer; forming a thin film of monocrystalline silicon, polycrystalline silicon, or amorphous silicon on an upper side of the sacrifice layer; opening a backside etching window in a back surface protective film having resistance to the etchant for etching the semiconductor substrate formed on a back surface of the semiconductor substrate; performing crystal anisotropic etching on the semiconductor substrate from a back side by applying the etchant from the back surface window to isotropically etch the sacrifice layer by the etchant when the etching reaches the front surface of the semiconductor substrate, and performing crystal anisotropic etching on the semiconductor substrate from a front side by the etchant spread to a space formed after the sacrifice layer is etching-removed to form a through-hole in the semiconductor substrate; and removing the thin film protective film leaving one part, and arranging a holder for supporting the thin film on an upper surface of the semiconductor substrate by the remained thin film protective film.

According to the method for manufacturing the first vibration sensor of the present invention, the through-hole is formed by performing crystal anisotropic etching on the semiconductor substrate of monocrystalline silicon from both front and back surfaces, and thus the opening area of the through-hole does not become too large compared to the area of the thin film, and the vibration sensor can be miniaturized. Therefore, the number of elements that can be fabricated from one wafer increases, and the cost of the vibration sensor can be lowered. According to the method for manufacturing the first vibration sensor, the through-hole can be formed from both surfaces through one etching step, and thus the manufacturing steps are simplified. Moreover, since the protective layer is formed between the sacrifice layer and the thin film, the thin film is prevented from being damaged by the etchant when forming the through-hole even if the thin film is made of a material that does not have resistance to the etchant of the semiconductor substrate. A vibration sensor of high productivity and high sensitivity can be obtained since the thin film is formed by monocrystalline silicon, polycrystalline silicon, or amorphous silicon.

A method for manufacturing a second vibration sensor of the present invention includes: forming, at one part of a front surface of a semiconductor substrate of monocrystalline silicon, a sacrifice layer with a material having resistance to a first etchant for etching the semiconductor substrate; forming a thin film protective film with a material having resistance to the first etchant on the sacrifice layer and the front surface of the semiconductor substrate at the periphery of the sacrifice layer; forming a thin film of monocrystalline silicon, polycrystalline silicon, or amorphous silicon on an upper side of the sacrifice layer; opening a backside etching window in a back surface protective film having resistance to the etchant for etching the semiconductor substrate formed on a back surface of the semiconductor substrate; performing crystal anisotropic etching on the semiconductor substrate from the back side by applying the first etchant from the back surface window; performing isotropic etching on the sacrifice layer by applying a second etchant from the back side of the semiconductor substrate after the etching by the first etchant reaches the front surface of the semiconductor substrate; performing, after the sacrifice layer is etching-removed, crystal anisotropic etching on the semiconductor substrate from the front side by again applying the first etchant from the back side of the semiconductor substrate to a space formed after the sacrifice layer is etching-removed to form a through-hole in the semiconductor substrate; and removing the thin film protective film leaving one part, and arranging a holder for supporting the thin film on an upper surface of the semiconductor substrate by the remained thin film protective film.

According to the method for manufacturing the second vibration sensor of the present invention, the through-hole is formed by performing crystal anisotropic etching on the semiconductor substrate from both front and back surfaces, and thus the opening area of the through-hole does not become too large compared to the area of the thin film, and the vibration sensor can be miniaturized. Therefore, the number of elements that can be fabricated from one wafer increases, and the cost of the vibration sensor can be lowered. According to the method for manufacturing the second vibration sensor, restrictions in selecting the first etchant and the second etchant is reduced since the etchant is changed between the step of performing crystal anisotropic etching of the through-hole and the step of etching the sacrifice layer. A vibration sensor of high productivity and high sensitivity can be obtained since the thin film is formed by monocrystalline silicon, polycrystalline silicon, or amorphous silicon.

An embodiment of the method for manufacturing the first or the second vibration sensor includes forming a vent hole for communicating the front side and the back side of the thin film between the holders. According to such an embodiment, the vent hole of a long length can be formed, and thus an acoustic resistance can be increased and satisfactory acoustic characteristics can be obtained when used in a microphone, and the like. Furthermore, an electrostatic pressure at the front and the back of the thin film can be balanced since the front side and the back side of the thin film are communicated with the vent hole.

In another embodiment of the method for manufacturing the first or the second vibration sensor, the thin film is a square. According to such an embodiment, the opening formed by performing crystal anisotropic etching of the monocrystalline silicon substrate can be effectively used.

In still another embodiment of the method for manufacturing the first or the second vibration sensor, the holder is arranged at four corners of the thin film. According to such a configuration, the sensitivity of the vibration enhances since the thin film can flexibly deform.

In yet another embodiment of the method for manufacturing the first or the second vibration sensor, the sacrifice layer is arranged at one part of the forming region of the thin film so that the thin film is bendable. According to such an embodiment, a displacement of the thin film can be increased and a deflection by stress can be reduced.

In yet another embodiment of the method for manufacturing the first or the second vibration sensor, the sacrifice layer is arranged at one part of the forming region of the thin film to form a projection on the front surface of the thin film. According to such an embodiment, the deformed thin film is prevented from area contacting and attaching to the electrode, and the like, when the electrode, and the like are arranged on the upper side of the thin film.

In yet another embodiment of the method for manufacturing the first or the second vibration sensor of the present invention, an area of the cross-section parallel to the opening at the interior of the through-hole is larger than the opening area of the front surface of the through-hole. According to such an embodiment, a volume of the through-hole can be increased, and thus acoustic compliance can be increased when the vibration sensor is used in the acoustic sensor.

In another embodiment of the method for manufacturing the first vibration sensor of the present invention, the sacrifice layer is made of polycrystalline silicon or amorphous silicon. According to such an embodiment, the sacrifice layer can be simultaneously etched when etching the semiconductor substrate of monocrystalline silicon, whereby the steps can be simplified. Since the polycrystalline silicon and the amorphous silicon have high temperature resistance, high temperature process can be used in the post-step, and the compliance with the semiconductor integrated circuit manufacturing step is also satisfactory.

A method for manufacturing a first microphone of the present invention includes the steps of: forming, on one part of a front surface of a semiconductor substrate of monocrystalline silicon, a sacrifice layer with a material isotropically etched by an etchant for etching the semiconductor substrate; forming a thin film protective film with a material having resistance to the etchant on the sacrifice layer and the front surface of the semiconductor substrate at a periphery of the sacrifice layer; forming a thin film of monocrystalline silicon, polycrystalline silicon, or amorphous silicon on an upper side of the sacrifice layer; forming a fixed electrode on an upper side of the thin film; opening a backside etching window in a back surface protective film having resistance to the etchant for etching the semiconductor substrate formed on a back surface of the semiconductor substrate; performing crystal anisotropic etching on the semiconductor substrate from a back side by applying the etchant from the back surface window to isotropically etch the sacrifice layer by the etchant when the etching reaches the front surface of the semiconductor substrate, and performing crystal anisotropic etching on the semiconductor substrate from a front side by the etchant spread to a space formed after the sacrifice layer is etching-removed to form a through-hole in the semiconductor substrate; and removing the thin film protective film leaving one part, and arranging a holder for supporting the thin film on an upper surface of the semiconductor substrate by the remained thin film protective film.

According to the first microphone of the present invention, the through-hole is formed by performing crystal anisotropic etching on the semiconductor substrate of monocrystalline silicon from both front and back surfaces, and thus the opening area of the through-hole does not become too large compared to the area of the thin film, and the vibration sensor can be miniaturized. Therefore, the number of elements that can be fabricated from one wafer increases, and the cost of the vibration sensor can be lowered. According to the method for manufacturing the first vibration sensor, the semiconductor substrate can be subjected to crystal anisotropic etching from both the front and the back surfaces starting from the crystal anisotropic etching of the semiconductor substrate from the back side, and thus an etching hole does not need to be formed in the thin film, and a risk of lowering the strength of the thin film or changing the characteristics of the thin film is eliminated. Furthermore, according to the method for manufacturing the first vibration sensor, the manufacturing steps are simplified as the through-hole can be formed from both surfaces in one etching step.

A method for manufacturing a second microphone of the present invention includes: forming, at one part of a front surface of a semiconductor substrate of monocrystalline silicon, a sacrifice layer with a material having resistance to a first etchant for etching the semiconductor substrate; forming a thin film protective film with a material having resistance to the first etchant on the sacrifice layer and the front surface of the semiconductor substrate at a periphery of the sacrifice layer; forming a thin film of monocrystalline silicon, polycrystalline silicon, or amorphous silicon on an upper side of the sacrifice layer; forming a fixed electrode on the upper side of the thin film; opening a backside etching window in a back surface protective film having resistance to the etchant for etching the semiconductor substrate formed on a back surface of the semiconductor substrate; performing crystal anisotropic etching on the semiconductor substrate from a back side by applying the first etchant from the back surface window; performing isotropic etching on the sacrifice layer by applying a second etchant from the back side of the semiconductor substrate after the etching by the first etchant reaches the front surface of the semiconductor substrate; performing, after the sacrifice layer is etching-removed, crystal anisotropic etching on the semiconductor substrate from a front side by again applying the first etchant from the back side of the semiconductor substrate to a space formed after the sacrifice layer is etching-removed to form a through-hole in the semiconductor substrate; and removing the thin film protective film leaving one part, and arranging a holder for supporting the thin film on an upper surface of the semiconductor substrate by the remained thin film protective film.

According to the second microphone of the present invention, the through-hole is formed by performing crystal anisotropic etching on the semiconductor substrate from both front and back surfaces, and thus the opening area of the through-hole does not become too large compared to the area of the thin film, and the vibration sensor can be miniaturized. Therefore, the number of elements that can be fabricated from one wafer increases, and the cost of the vibration sensor lowers. According to the method for manufacturing the first vibration sensor, the semiconductor substrate can be subjected to crystal anisotropic etching from both the front and the back surfaces starting from the crystal anisotropic etching of the semiconductor substrate from the back side, and thus an etching hole does not need to be formed in the thin film, and a risk of lowering the strength of the thin film or changing the characteristics of the thin film is eliminated. Furthermore, according to the method for manufacturing the first vibration sensor, restrictions in selecting the first etchant and the second etchant is reduced since the etchant is changed between the step of performing crystal anisotropic etching of the through-hole and the step of etching the sacrifice layer.

A vibration sensor of the present invention includes: a semiconductor substrate of monocrystalline silicon formed with a through-hole passing from front to back; a holder made of a material having resistance to an etchant for forming the through-hole by etching the semiconductor substrate, and arranged on a front surface of the semiconductor substrate; and a thin film having corners supported by the holder, and covering an opening on the substrate front surface side of the through-hole; wherein an area of a cross-section parallel to the substrate front surface of the through-hole gradually decreases or increases from the front surface towards a back surface of the semiconductor substrate, and changes from decrease to increase or from increase to decrease at a middle of the front surface and the back surface of the semiconductor substrate.

According to the vibration sensor of the present invention, the area of the cross-section parallel to the substrate front surface of the through-hole gradually decreases or increases from the front surface towards the back surface of the semiconductor substrate, and changes from decrease to increase or from increase to decrease at a middle of the front surface and the back surface of the semiconductor substrate, and thus the ratio of the opening area of the through-hole at the front surface of the semiconductor substrate and the opening area of the through-hole at the back surface approaches one, and the vibration sensor can be miniaturized. Since the volume of the through-hole can be increased, the acoustic compliance can be increased when using the vibration sensor in the acoustic sensor.

The configuring elements described above in the present invention may be arbitrarily combined as much as possible.

DESCRIPTION OF SYMBOLS

Figure 1:
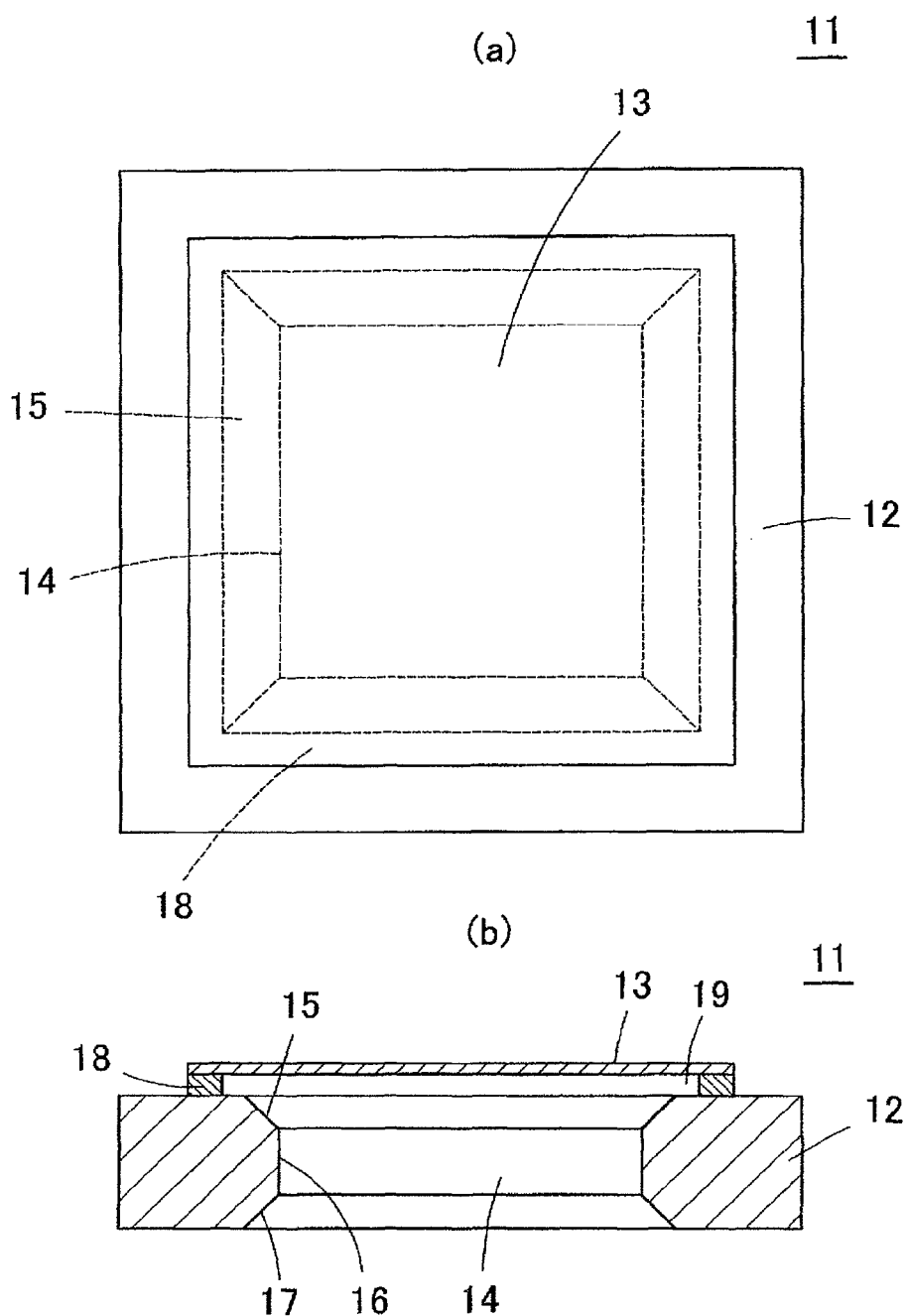
FIG. 1(a) is a plan view showing a structure of a vibration sensor according to a first embodiment of the present invention.
FIG. 1(b) is a cross-sectional view thereof.

11 Vibration sensor
12 Si substrate
13 Thin film
14 Through-hole
18 Holder
20, 21 Protective film
22 Etching window
23 Sacrifice layer
24, 25 Protective film
26 Backside etching window
31 Vibration sensor
32 Sacrifice layer
33 Protective film
41 Vibration sensor
42 Bent portion
43 Stopper
44a to 44e Sacrifice layer
45, 46 Protective film
49 Protective film
50 Backside etching window
71 Microphone
72 Back plate
73 Metal electrode
74 Acoustic hole
75 Acoustic hole

BEST MODE FOR CARRYING OUT THE INVENTION

Embodiments of the present invention will now be described in detail below according to the drawings. It should be recognized that the present invention is not limited to the following embodiments.

First Embodiment

FIG. 1(a) is a plan view showing a structure of a vibration sensor 11 according to a first embodiment of the present invention, and FIG. 1(b) is a cross-sectional view thereof. The vibration sensor 11 is used in an acoustic sensor such as a semiconductor microphone and an ultrasonic sensor, a thin film filter, and the like. The vibration sensor 11 includes an Si substrate 12, and a thin film 13 (diaphragm). The Si substrate 12 is a (100) plane substrate. The Si substrate 12 is etched from the back side so as to form a rectangular through-hole 14, which is passed through from the front to the back and which side in each horizontal and vertical direction lies in the (110) direction. The through-hole 14 has inclined surfaces 15, 17 formed on the front side and the back side by a (111) plane or a crystal plane equivalent thereto, and a vertical surface 16 is formed between the inclined surfaces 15, 17. The vertical surface 16 is actually configured by a plurality of crystal planes such as a (110) plane, a (311) plane, and a (411) plane, but is shown as a vertical plane for simplification. Therefore, the cross-section of the substrate at the edge of the through-hole 14 has a shape tapered at the front and the back.

The thin film 13 is arranged on the upper surface of the Si substrate 12 so as to cover the opening on the front side of the through-hole 14, and the entire periphery of the lower surface is fixed to the upper surface of the Si substrate 12 by a holder 18. A narrow gap 19 forms between the opening on the front side (or surface that was the front surface of the Si substrate 12) of the through-hole 14 and the back surface of the thin film 13 by the holder 18.

According to the vibration sensor 11 of such a structure, although the through-hole 14 is formed by etching the Si substrate 12 from the back side, the opening area on the back side does not become too large compared to the opening on the front side of the through-hole 14. Therefore, the area of the Si substrate 12 does not become large by the through-hole 14 as in the first related art. The Si substrate 12 merely needs to have a size capable of mounting the thin film 13 and circuit components, as necessary, and the vibration sensor 11 can be miniaturized.

Manufacturing steps of the vibration sensor 11 will now be described according to FIGS. 2(a) to (d), FIGS. 3(a) to (d), and FIGS. 4(a) to (c). It should be noted that although a multiple number of the vibration sensors 11 is manufactured at once on a wafer, only one vibration sensor 11 will be shown and described in the following description.

Figure 2:
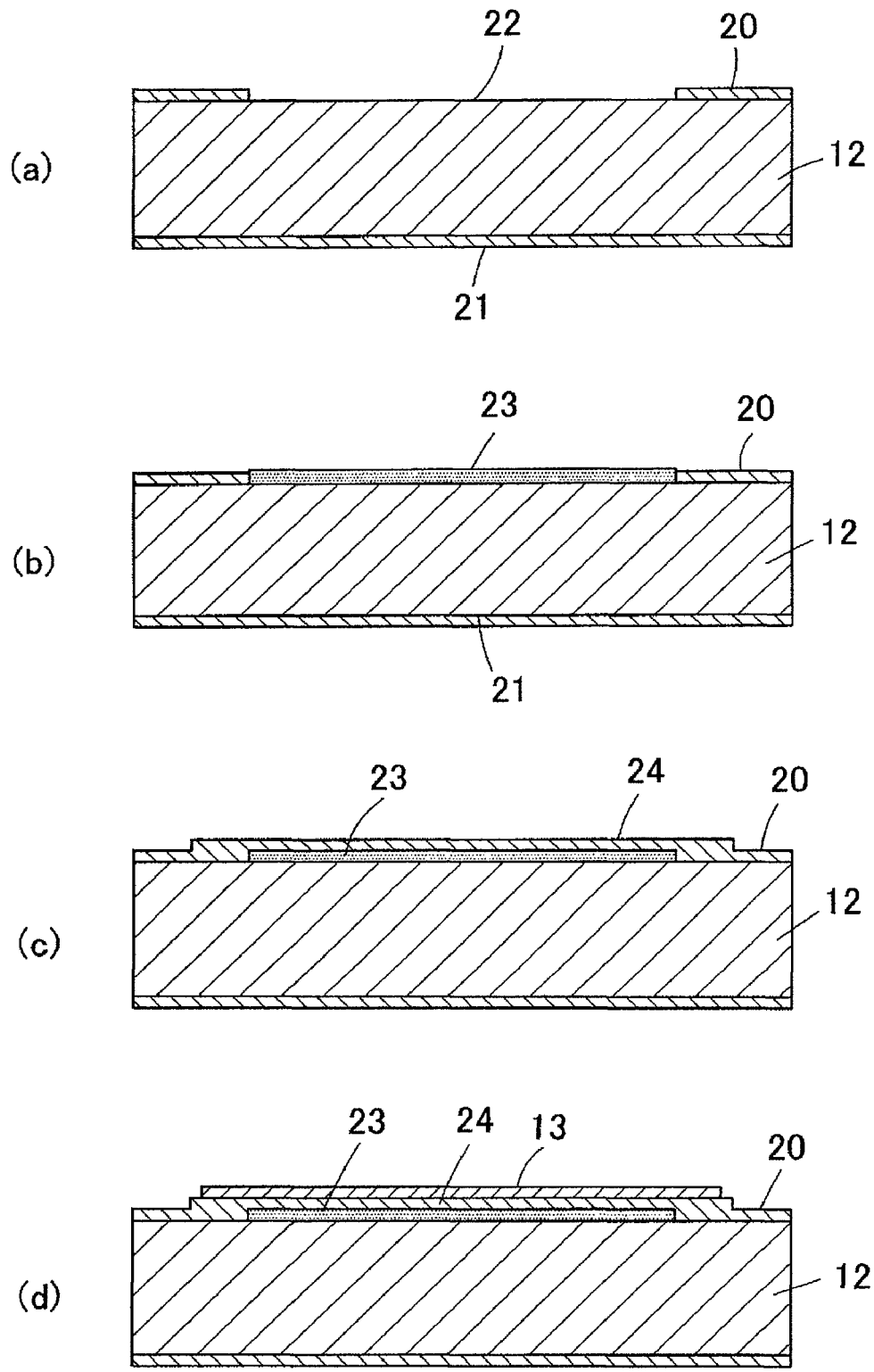
FIGS. 2(a) to (d) are cross-sectional views describing manufacturing steps of the vibration sensor of the first embodiment.

First, as shown in FIG. 2(a), protective films 20, 21 of SiO₂ are formed on the front surface and the back surface of the (100) plane Si substrate 12 through thermal oxidation method, and the like. The protective film 20 at a region to form the gap 19 is then partially removed using a photolithography technique at the front surface of the Si substrate 12, thereby opening a rectangular etching window 22.

A polycrystalline silicon thin film is formed on the front surface of the Si substrate 12 from above the protective film 20, and the polycrystalline silicon thin film on the protective film 20 is removed using the photolithography technique. A rectangular sacrifice layer 23 of polycrystalline silicon thin film thereby forms on the front surface of the Si substrate 12 in the etching window 22. This state is shown in FIG. 2(b).

A protective film 24 of SiO₂ is then formed on the front surface of the Si substrate 12 from above the sacrifice layer 23, so that the sacrifice layer 23 is covered by the protective film 24, as shown in FIG. 2(c).

A polycrystalline silicon thin film is then formed on the protective film 24, and the unnecessary portion of the polycrystalline silicon thin film is removed using the photolithography technique, so that the thin film 13 of polycrystalline silicon thin film forms on the protective film 24, as shown in FIG. 2(d). Furthermore, as shown in FIG. 3(a), a rectangular protective film 25 of SiO₂ is formed on the thin film 13, so that the thin film 13 is covered by the protective film 25.

Figure 3:
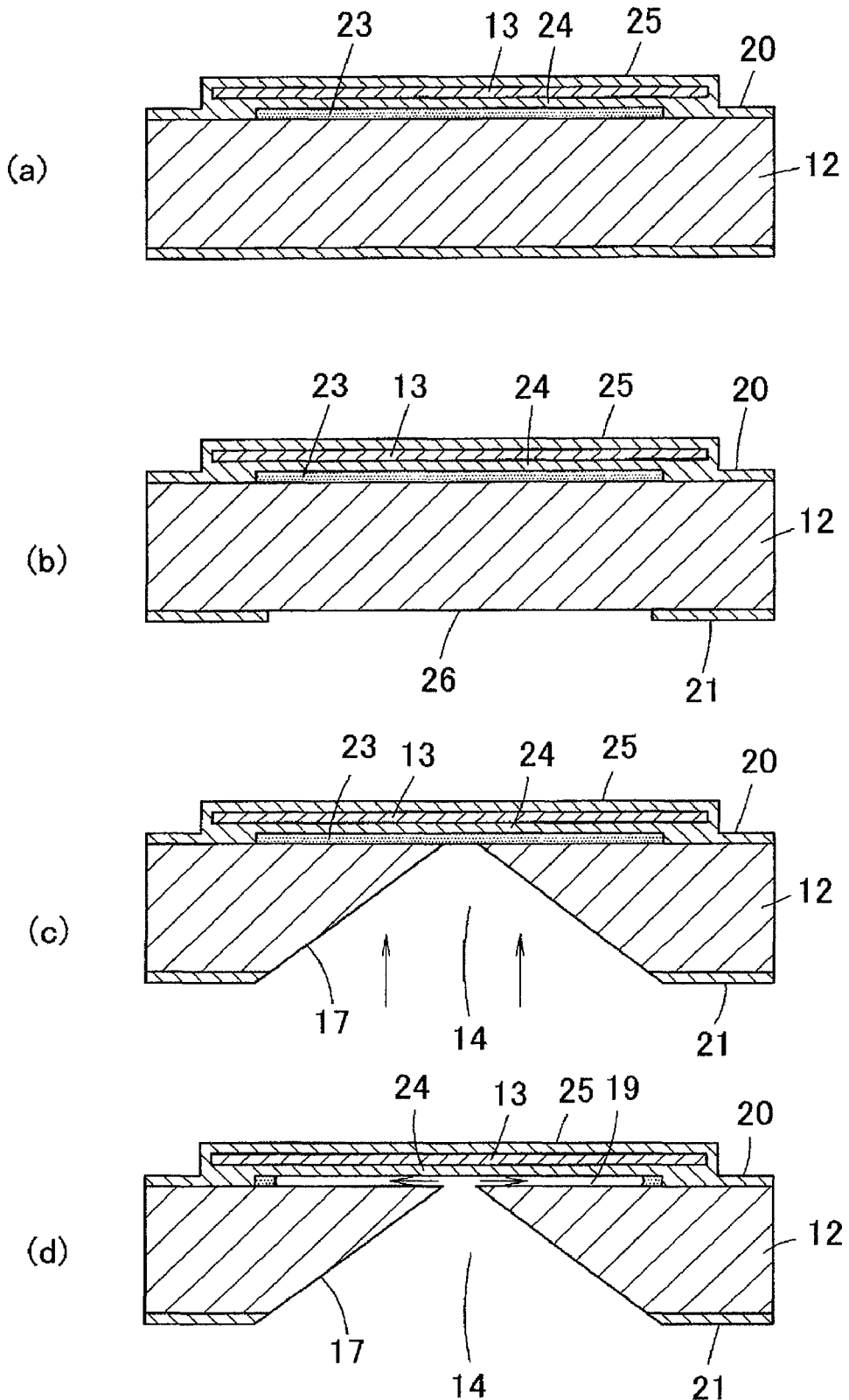
FIGS. 3(a) to (d) are cross-sectional views describing the manufacturing steps of the vibration sensor of the first embodiment, following FIG. 2(d).

Thereafter, as shown in FIG. 3(b), part of the protective film 21 is partially removed using the photolithography technique at the back surface of the Si substrate 12, thereby opening a backside etching window 26 to a rectangular shape in the protective film 21. The backside etching window 26 merely needs to have a size for crystal anisotropic etching started from the backside etching window 26 to reach the front surface of the Si substrate 12, where a relatively small backside etching window 26 having one side of about 570 μm is enough for the Si substrate 12 having a thickness of 400 μm. The dimension of the vertical and horizontal size of the sacrifice layer 23 is determined by the dimension of the vertical and horizontal size of the necessary thin film 13, and one side is about 650 μm, for example.

After the backside etching window 26 is opened, etching is performed from the backside etching window 26 by soaking in etchant such as TMAH, KOH, or EDP (hereinafter referred to as etchant such as TMAH). The etchant such as TMAH performs crystal anisotropic etching on the Si, and thus etching advances along the (111) plane and the crystal plane (inclined surface 17) equivalent thereto at the back surface of the Si substrate 12, thereby forming the through-hole 14 having a truncated pyramid shape at the back surface of the Si substrate 12.

When the through-hole 14 reaches the front surface of the Si substrate 12 in such a manner, the sacrifice layer 23 is exposed to the interior of the through-hole 14, as shown in FIG. 3(c). The protective films 20, 21, 24 and 25 of SiO₂ are not etched by the etchant such as TMAH, but the sacrifice layer 23 of polycrystalline silicon is subjected to isotropic etching by the etchant such as TMAH. Thus, when the sacrifice layer 23 is exposed to the interior of the through-hole 14, etching proceeds from the portion exposed in the through-hole 14 towards the periphery, thereby forming the gap 19 between the protective film 24 and the front surface of the Si substrate 12, as shown in FIG. 3(d).

In this state, the thin film 13 and the protective films 24, 25 are lifted from the front surface of the Si substrate 12 by the gap 19, and thus can function as thin films. However, since the gap 19 is a space of thin thickness, damping effect occurs when the thin film 13 and the protective films 24, 25 vibrate, which may degrade vibration characteristics of a high frequency band or become a cause of mechanical noise, and the thin film 13 and the protective films 24, 25 tend to easily stick (attach) to the Si substrate 12. To prevent such drawbacks, etching of the Si substrate 12 is further continued at the lower side of the thin film 13.

It should be noted that thicker the thickness of the gap 19 (sacrifice layer 23), an etching rate becomes faster, but if too thick, formation time of the sacrifice layer 23 becomes longer or a covering property of the protective film 24 degrades. Thus the thickness is designed in view of the above, and is, for example, about 1 μm. The thickness of the thin film 13 is designed in view of the trade-off with the sensitivity and the strength of the vibration sensor 11, and is, for example, about 1 μm.

When the gap 19 is created between the protective film 24 and the front surface of the Si substrate 12, the etchant enters the gap 19, and performs crystal anisotropic etching on the Si substrate 12 from the front side. In such anisotropic etching, etching advances in the direction shown by the arrow in FIG. 4(a), thereby forming the inclined surface 15 in the through-hole 14. Furthermore, since the etching rate is large at the pointed end portion of the edge of the through-hole 14, corners are removed at the inner peripheral surface of the through-hole 14 thereby forming the vertical surface 16, and the through-hole 14 is etched to a shape similar to a doughnut hole. The Si substrate 12 is pulled out from the etchant at a point the sacrifice layer 23 is completely etching-removed, as shown in FIG. 4(b).

Figure 4:
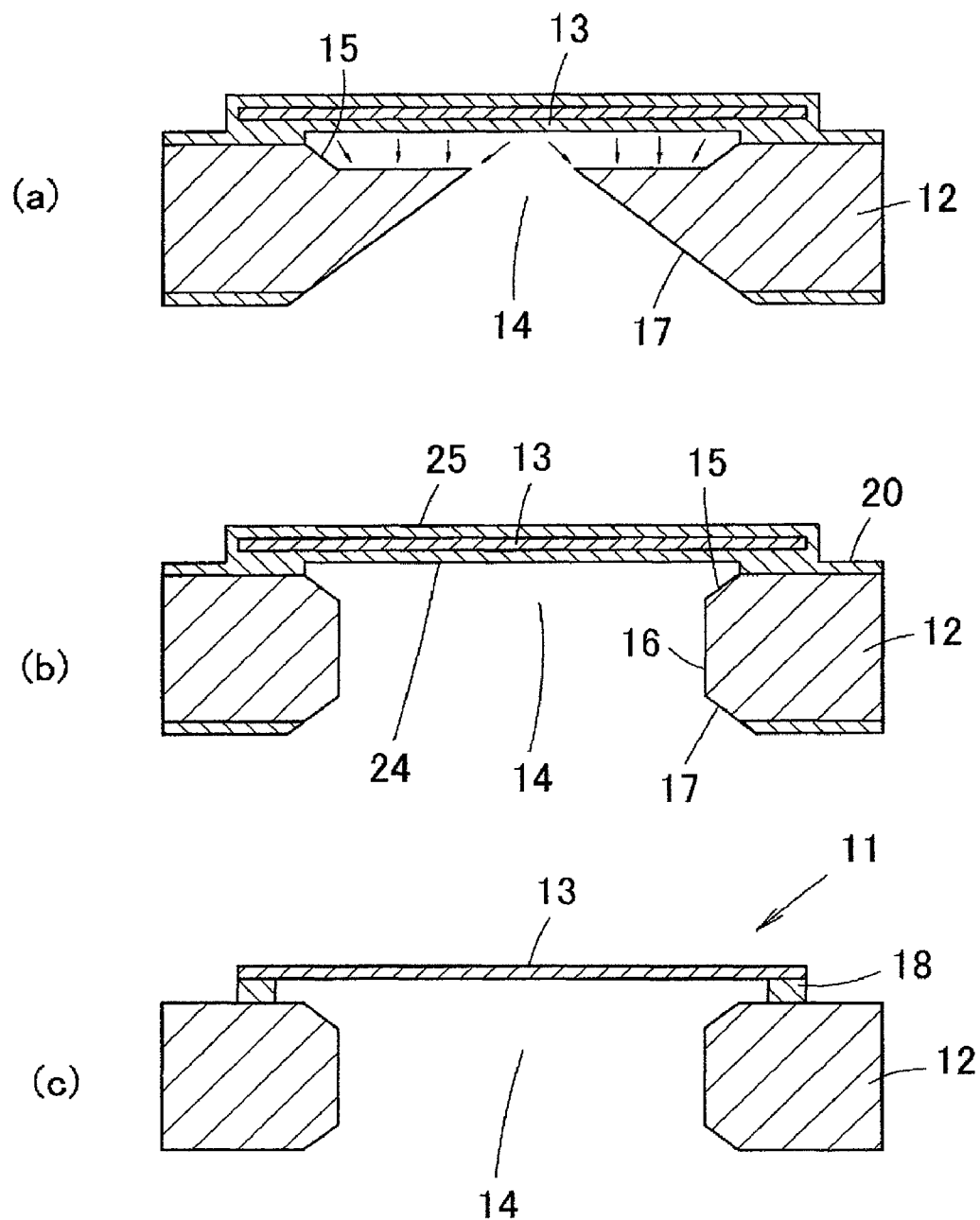
FIGS. 4(a) to (c) are cross-sectional views describing the manufacturing steps of the vibration sensor of the first embodiment, following FIG. 3(d).

After washing the Si substrate 12, the protective films 20, 21, 24, and 25 of SiO₂ are etched with HF aqueous solution, and the like, where etching is terminated at a point only the holder 18 made from part of the protective films 20, 24 remained, washing and drying are performed, and the vibration sensor 11 is completed, as shown in FIG. 4(c).

The through-hole 14 of small spreading can be opened at the back side and the vibration sensor 11 can be miniaturized with only the etching from the back side of the Si substrate 12 by fabricating the vibration sensor 11 in the above manner. Furthermore, since the through-hole 14 can be opened through etching of only from the back side, the etching hole does not need to be opened in the thin film 13, and a risk of changing physical characteristics of the thin film 13 in the vibration sensor 11 or lowering the strength of the thin film 13 is reduced.

The opening area on the back side of the through-hole 14 is determined by the size of the backside etching window 26 opened in the protective film 21, and the opening area on the front side of the through-hole 14 is determined by the size of the sacrifice layer 23, and thus the opening area of the through-hole 14 can be accurately controlled according to the above-described manufacturing method.

In the above embodiment, the sacrifice layer 23 is made of polycrystalline silicon, but amorphous silicon may also be used.

Second Embodiment

Figure 5:
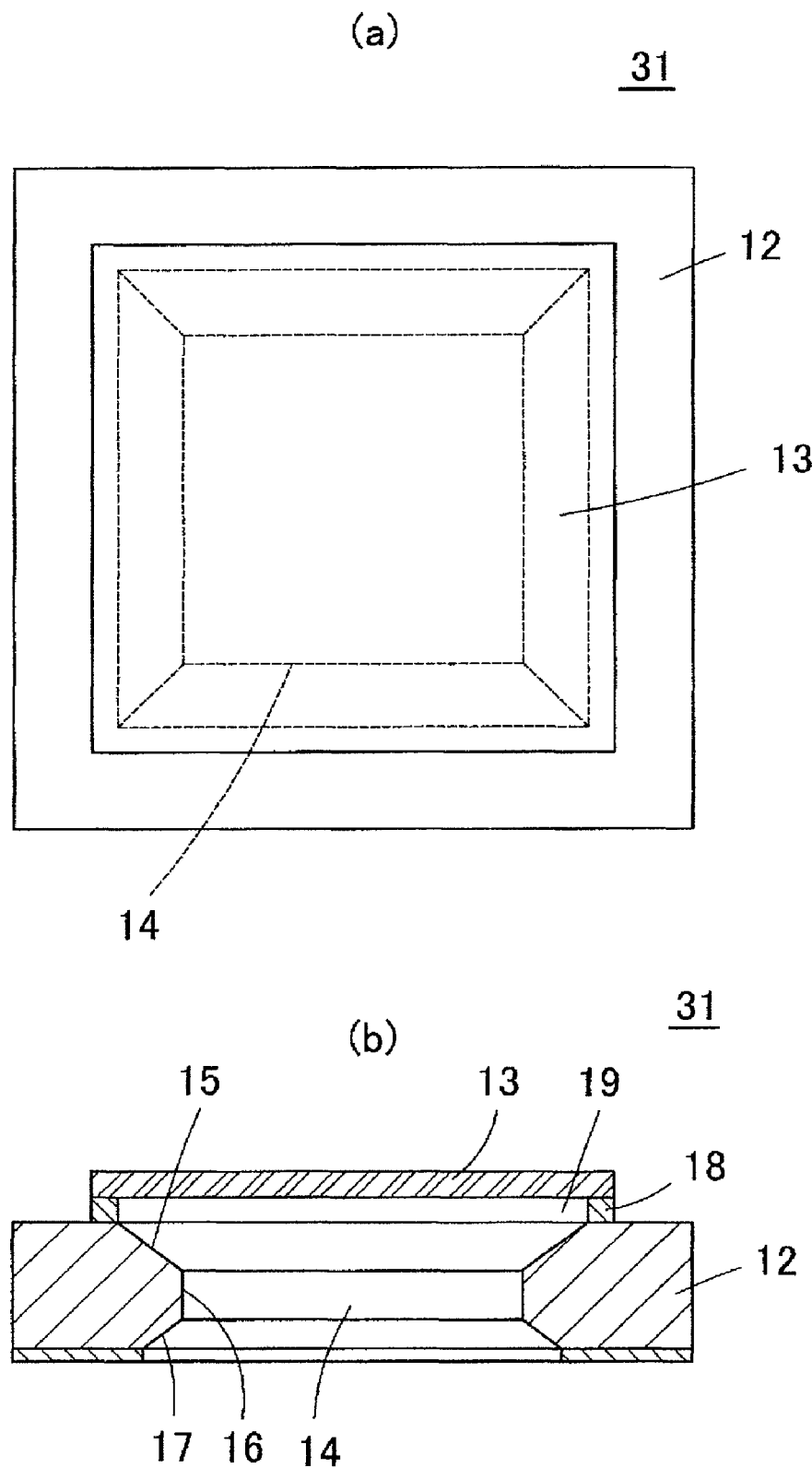
FIG. 5(a) is a plan view showing a vibration sensor according to a second embodiment of the present invention.
FIG. 5(b) is a cross-sectional view thereof.

FIG. 5(a) is a plan view showing a vibration sensor 31 according to the second embodiment of the present invention, and FIG. 5(b) is a cross-sectional view thereof. In the vibration sensor 31, the thin film 13 of polycrystalline silicon is formed on the Si substrate 12 so as to cover the upper surface of the through-hole 14. The thin film 13 has the lower surface of the outer peripheral part supported by the holder 18 at the upper surface of the Si substrate 12 and is lifted from the upper surface of the Si substrate 12, where a region surrounded by the holder 18 is deformable.

FIGS. 6(a) to (d) and FIGS. 7(a) to (d) are cross-sectional views describing the manufacturing steps of the vibration sensor 31. The manufacturing steps of the vibration sensor 31 will be described below according to FIGS. 6(a) to (d) and FIGS. 7(a) to (d).

Figure 6:
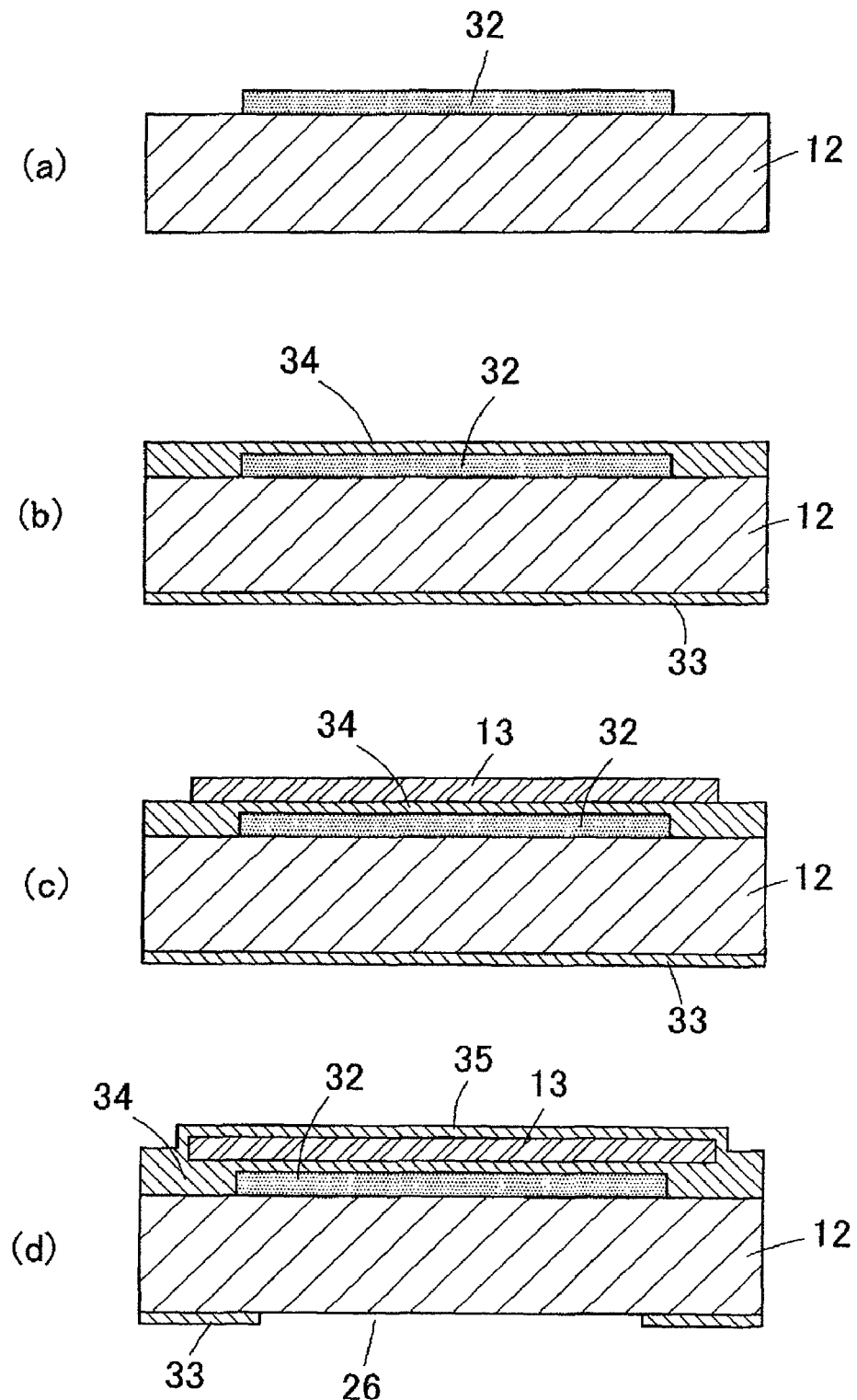
FIGS. 6(a) to (d) are cross-sectional views describing manufacturing steps of the vibration sensor of the second embodiment.

First, after forming the $SiO_2$ thin film on the upper surface of the Si substrate 12, the unnecessary portion of the $SiO_2$ thin film is removed using the photolithography technique, so that a sacrifice layer 32 of the $SiO_2$ thin film forms only in the region where the thin film 13 is to be lifted from the upper surface of the Si substrate 12, as shown in FIG. 6(a).

A protective film 34 of SiN is then formed on the front surface of the Si substrate 12 from above the sacrifice layer 32, so that the sacrifice layer 32 is covered by the protective film 34, as shown in FIG. 6(b). The thin film 13 of polycrystalline silicon is then formed on the front surface of the protective film 34, as shown in FIG. 6(c).

A protective film 35 of SiN is then formed on the front surface of the protective film 34 from above the thin film 13, so that the thin film 13 is covered by the protective film 35, as shown in FIG. 6(d). A protective film 33 made of material other than $SiO_2$ is also formed on the back surface of the Si substrate 12. In this case, if the protective film 33 is formed by SiN thin film, the protective film 34 or the protective film 35 and the protective film 33 can be formed all at once in the same step. After the protective film 33 is formed on the back surface of the Si substrate 12, part of the protective film 33 is opened to a rectangular shape using the photolithography technique, thereby forming the backside etching window 26, as shown in FIG. 6(d). The backside etching window 26 merely needs to have a size for crystal anisotropic etching performed from the backside etching window 26 to reach the front surface of the Si substrate 12.

Figure 7:
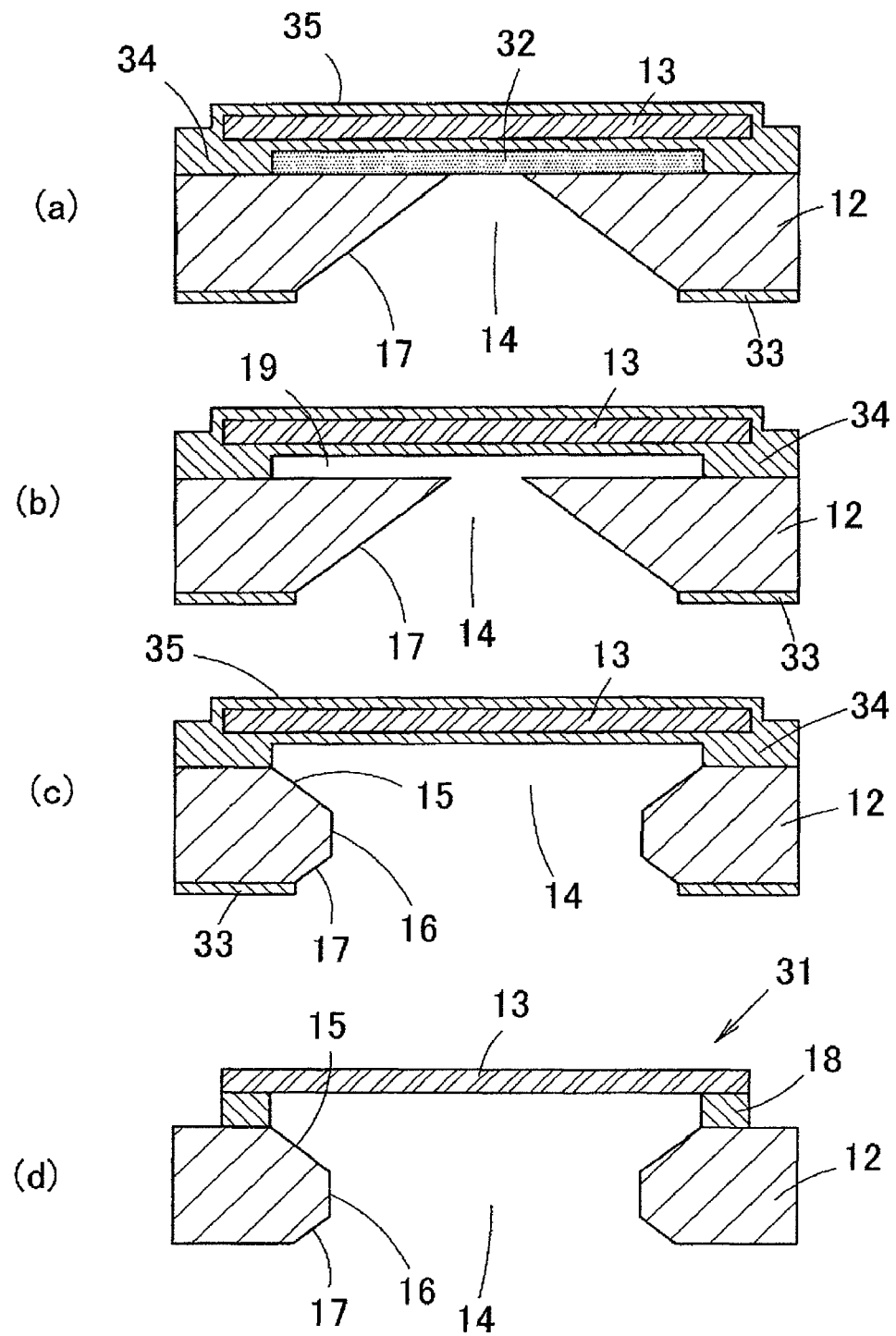
FIGS. 7(a) to (d) are cross-sectional views describing the manufacturing steps of the vibration sensor of the second embodiment, following FIG. 6(d).

After the backside etching window 26 is opened, the Si substrate 12 is soaked in the etchant such as TMAH to etch the Si substrate 12 from the backside etching window 26, thereby forming the through-hole 14 in the Si substrate 12. The etchant such as TMAH performs crystal anisotropic etching on the Si, and thus etching advances along the (111) plane and the crystal plane equivalent thereto at the back surface of the Si substrate 12, and ultimately the through-hole 14 reaches the front surface of the Si substrate 12 and the sacrifice layer 32 is exposed to the interior of the through-hole 14, as shown in FIG. 7(a).

The sacrifice layer 32 of $SiO_2$ is not etched by the etchant such as TMAH, and thus the etching process is terminated when the sacrifice layer 32 is exposed, and then the Si substrate 12 is washed.

The Si substrate 12 is then soaked in the HF aqueous solution. The HF aqueous solution does not invade the Si substrate 12 but isotropically etches the $SiO_2$, and thus the sacrifice layer 32 is etched from the exposed portion towards the periphery by the HF aqueous solution entered into the through-hole 14 from the back side of the Si substrate 12, whereby the gap 19 forms between the thin film 13 and the front surface of the Si substrate 12, as shown in FIG. 7(b).

After the sacrifice layer 32 is completely removed by etching, the Si substrate 12 is washed, and then again soaked in the etchant such as TMAH. This etchant enters the gap 19 and performs crystal anisotropic etching on the Si substrate 12 from the front side. As a result, the corners of the Si substrate 12 are removed at the inner peripheral surface of the through-hole 14 thereby forming the inclined surface 15 and the vertical surface 16, and the through-hole 14 is etched to a shape similar to a doughnut hole, as in the first embodiment. The Si substrate 12 is pulled out from the etchant after the desired through-hole 14 is formed, as shown in FIG. 7(c), and then washed and dried. Finally, as shown in FIG. 7(d), the protective films 33, 34, 35 of SiN are removed by heated phosphoric acid aqueous solution, or the like, and the vibration sensor 31 is completed.

The through-hole 14 of small spreading can be opened at the back side and the vibration sensor 31 can be miniaturized with only the etching from the back side of the Si substrate 12 by fabricating the vibration sensor 31 in the above manner. Furthermore, since the through-hole 14 can be opened through etching of only from the back side, the etching hole does not need to be opened in the thin film 13, and the risk of changing the physical characteristics of the thin film 13 in the vibration sensor 31 or lowering the strength of the thin film 13 is reduced.

The opening area on the back side of the through-hole 14 is determined by the size of the backside etching window 26 opened in the protective film 33, and the opening area on the front side of the through-hole 14 is determined by the size of the sacrifice layer 32, and thus the opening area of the through-hole 14 can be accurately controlled according to the above-described manufacturing method.

Moreover, since the etchant is changed between the step of performing crystal anisotropic etching of the through-hole and the step of etching the sacrifice layer, restrictions in selecting the etchant in the respective steps is reduced. The step management such as yield inspection can also be carried out in each etching step as continuous transition is not made from the crystal anisotropic etching to the isotropic etching.

In the first embodiment, the crystal anisotropic etching and the isotropic etching are performed by the same etchant, and thus the crystal anisotropic etching and the isotropic etching can be continuously performed in the same device, and working efficiency is high. In the second embodiment, on the other hand, the crystal anisotropic etching and the isotropic etching are performed in separate steps, and thus the restriction in the means of crystal anisotropic etching and the means of isotropic etching is reduced, where the isotropic etching may be chemical etching using corrosive gas other than the aqueous solution.

Third Embodiment

Figure 8:
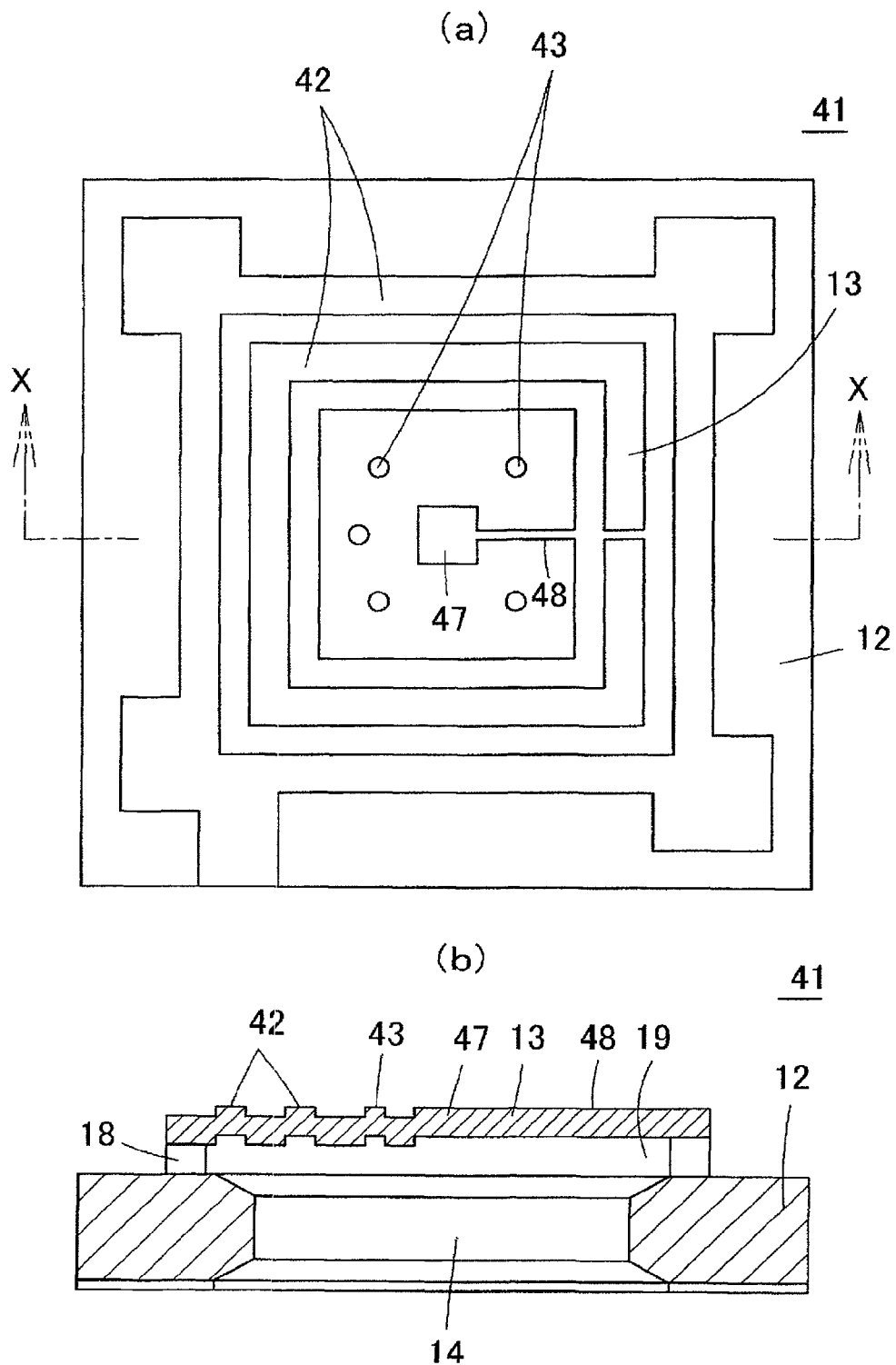
FIG. 8(a) is a plan view showing a structure of a vibration sensor according to a third embodiment of the present invention.
FIG. 8(b) is a cross-sectional view taken along line X-X of FIG. 8(a).

FIG. 8(a) is a plan view showing a structure of a vibration sensor 41 according to the third embodiment of the present invention, and FIG. 8(b) is a cross-sectional view taken along line X-X of FIG. 8(a). The vibration sensor 41 has a corrugated structure and a functional portion such as a stopper 43 arranged in the thin film 13.

The corrugated structure of the thin film 13 is configured by two bent portions 42 having a square annular shape. Each bent portion 42 is bent such that the cross-section thereof projects to the upper side of the thin film 13. It has been reported in "The fabrication and use of micromachined corrugated silicon diaphragms" (J. H. Jerman, Sensors and Actuators A21-A23 pp. 998-992, 1992) that a displacement of the thin film 13 increases and a deflection by stress reduces by forming the corrugated structure in the thin film 13.

The stopper 43 is formed by projecting the front surface of the thin film 13 to a round projection shape. In a case of an electrostatic capacity vibration sensor (e.g., microphone etc. to be hereinafter described), the thin film 13 becomes a movable electrode, and an opposite electrode (fixed electrode) is arranged on the upper surface of the thin film 13. In the case of the electrostatic capacity vibration sensor, arranging the stopper 43 on the upper surface of the thin film 13 prevents the thin film 13 from being adsorbed to the opposite electrode by electrostatic force caused by charging of charges of the vibration sensor 41, capillary force caused by moisture attachment, and the like by the stopper 43 abutting on the fixed electrode even if the thin film 13 greatly deforms.

Figure 9:
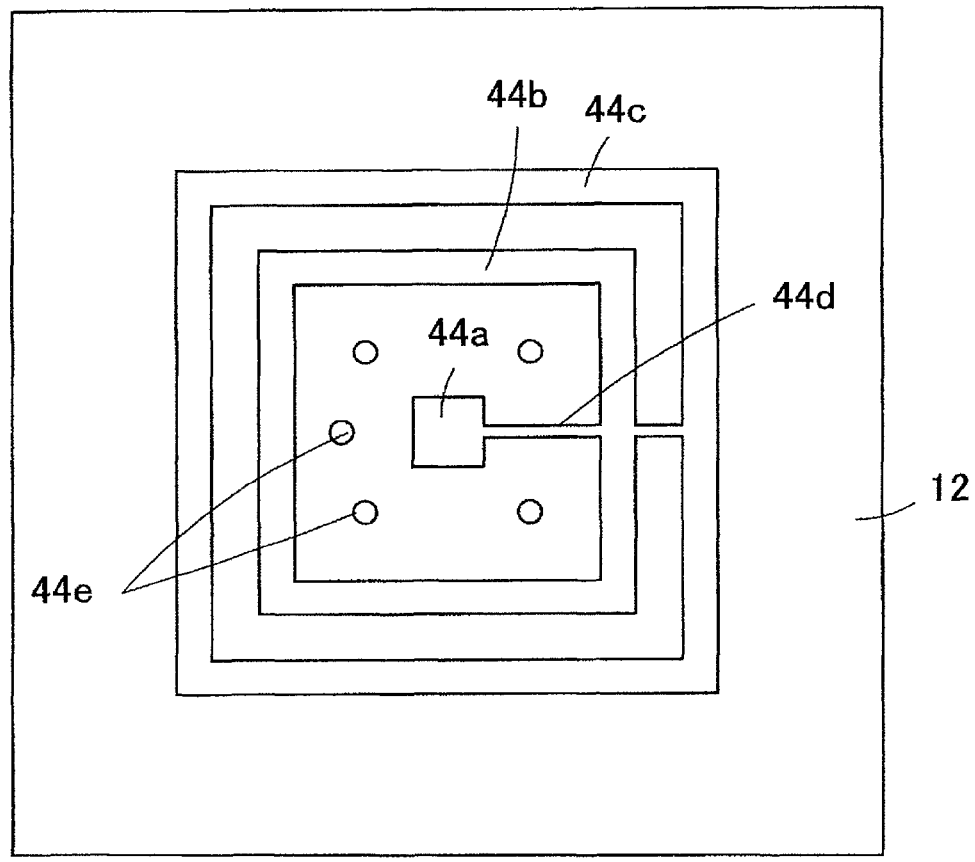
FIGS. 9(a) and (b) are a plan view and a cross-sectional view describing manufacturing steps of the vibration sensor of the third embodiment.
Figure 9:
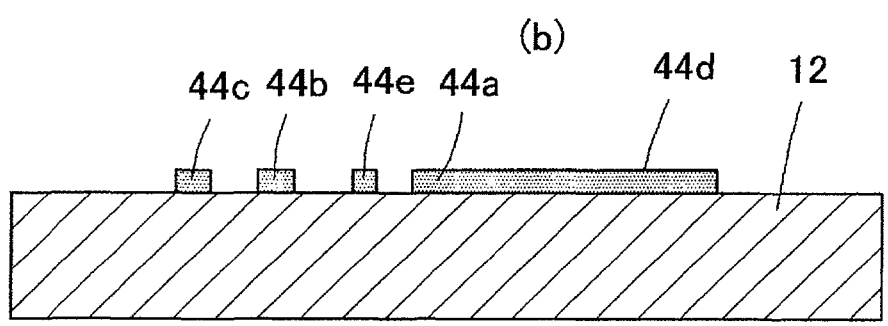
Figure 10:
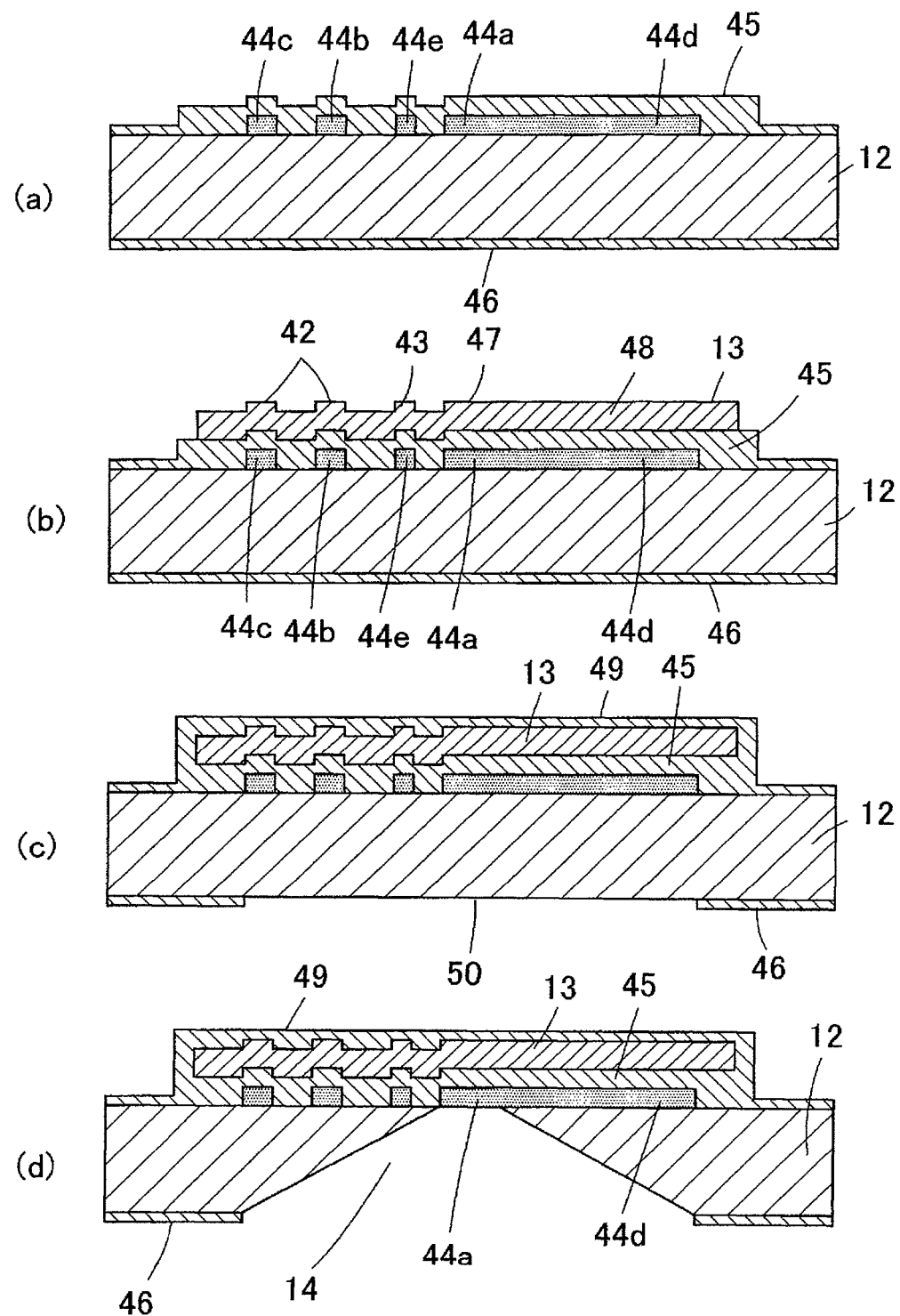
FIGS. 10(a) to (d) are cross-sectional views describing the manufacturing steps of the vibration sensor of the third embodiment, following FIG. 9.
Figure 11:
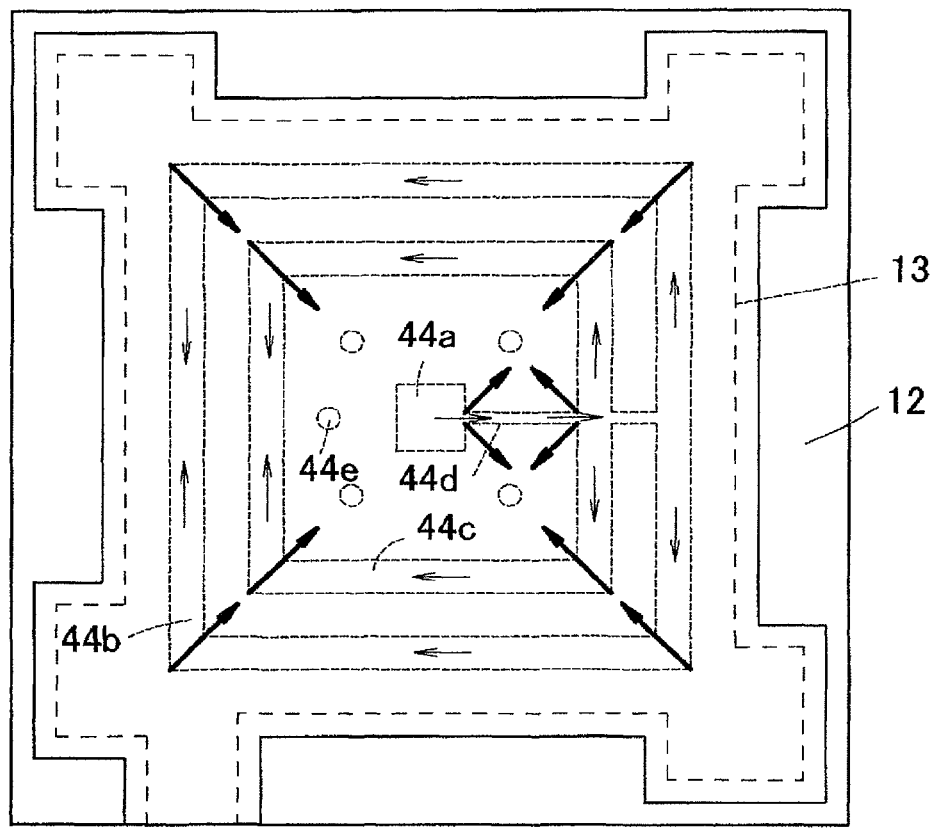
FIGS. 11(a) and (b) are a plan view and a cross-sectional view describing the manufacturing steps of the vibration sensor of the third embodiment, following FIG. 10(d).
Figure 11:
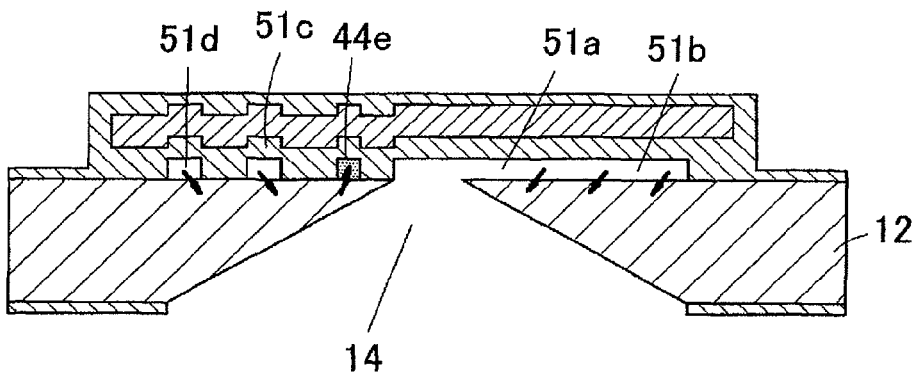
Figure 12:
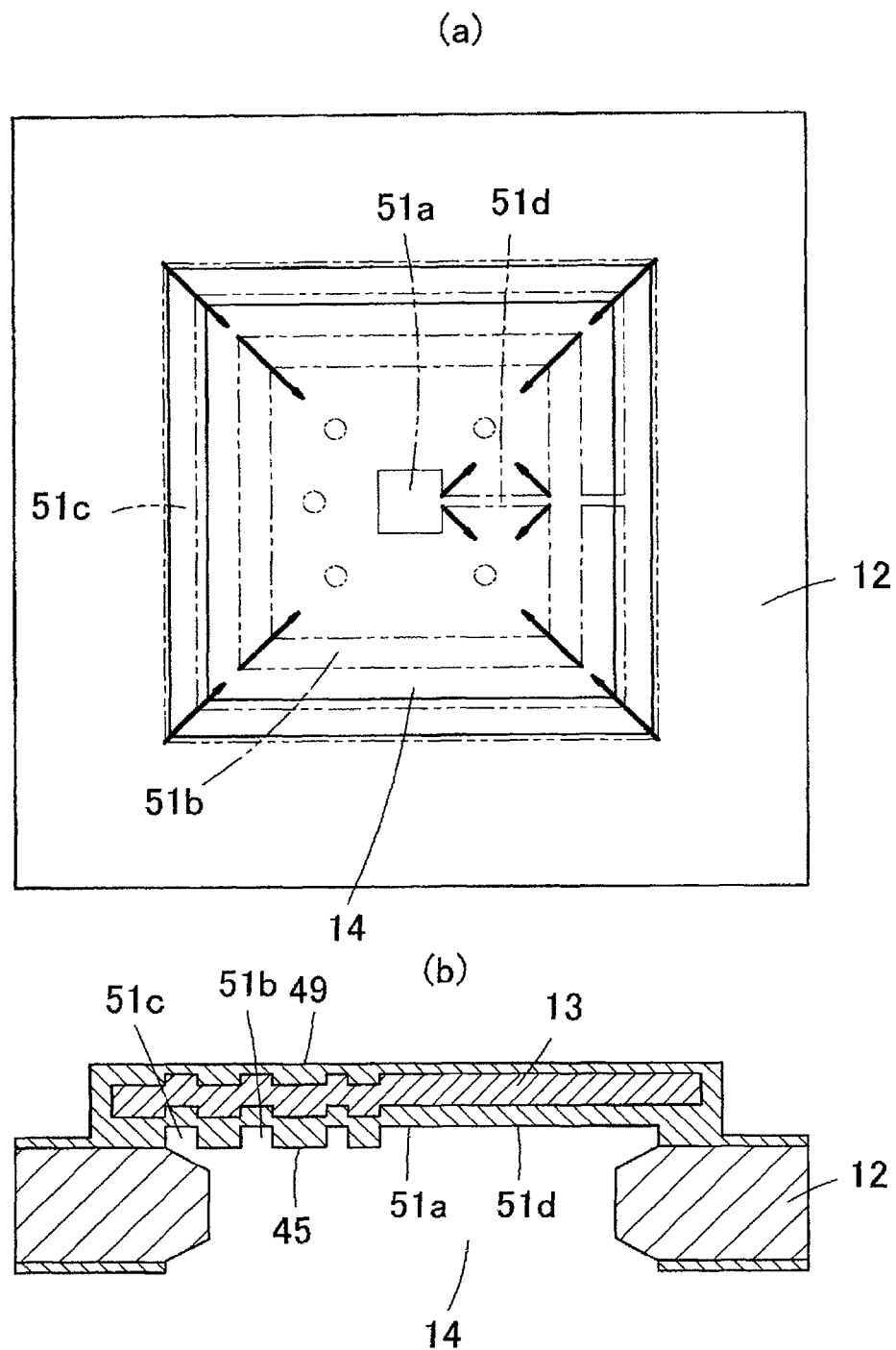
FIGS. 12(a) and (b) are a plan view and a cross-sectional view describing the manufacturing steps of the vibration sensor of the third embodiment, following FIG. 11.
Figure 13:
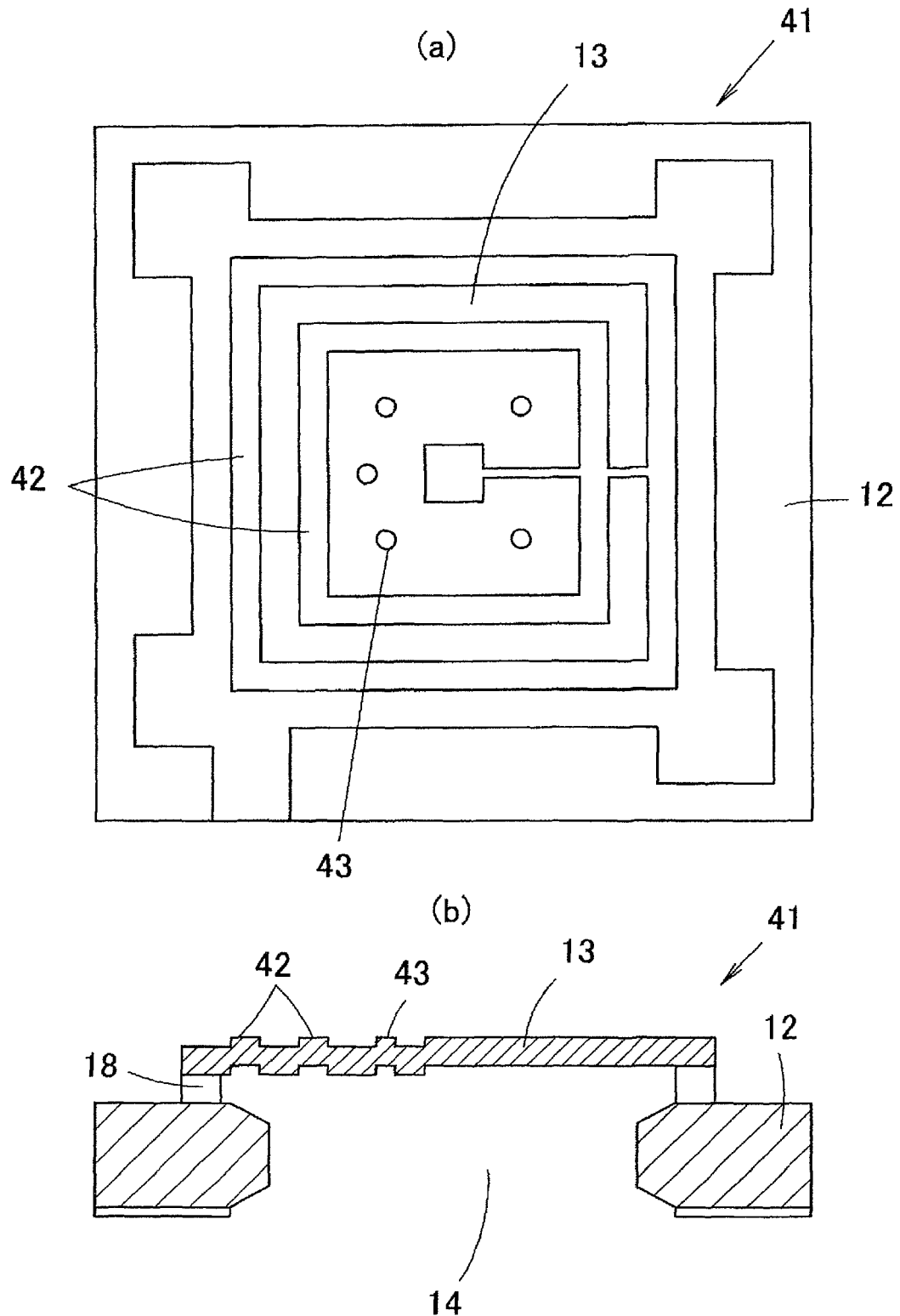
FIGS. 13(a) and (b) are a plan view and a cross-sectional view describing the manufacturing steps of the vibration sensor of the third embodiment, following FIG. 12.

FIGS. 9(a) and (b), FIGS. 10(a) to (d), FIGS. 11(a) and (b), FIGS. 12(a) and (b), and FIGS. 13(a) and (b) are views describing the manufacturing steps of the vibration sensor 41. The manufacturing steps of the vibration sensor 41 will be described below according to FIG. 9 to FIG. 13. First, as shown in FIGS. 9(a) and (b), a sacrifice layer of polycrystalline silicon thin film is formed to a predetermined pattern on the front surface of the Si substrate 12. The sacrifice layer includes a square sacrifice layer 44a positioned at a central part, square annular-shaped sacrifice layers 44b, 44c formed at the forming region of the bent portion 42, a linear sacrifice layer 44d connecting the sacrifice layers 44a to 44c, and a sacrifice layer 44e formed in the forming region of the stopper 43.

Then, as shown in FIG. 10(a), the front surface of the Si substrate 12 is covered with a protective film 45 of $SiO_2$ from above the sacrifice layers 44a to 44e, and a protective film 46 of $SiO_2$ is also formed on the back surface of the Si substrate 12. In this case, the protective film 45 is formed on each sacrifice layer 44a to 44e, and thus the protective film 45 is bulged upward at the portion of each sacrifice layer 44a to 44e.

As shown in FIG. 10(b), the thin film 13 of polycrystalline silicon thin film is formed on the protective film 45. The thin film 13 is lifted up by each sacrifice layer 44a to 44e by way of the protective film 45 at the region of each sacrifice layer 44a to 44e, and thus the bent portion 42 forms on the sacrifice layers 44b, 44c and the stopper 43 forms on the sacrifice layer 44e. The thin film 13 is also bulged upward on the sacrifice layers 44a and 44d, thereby forming projections 47, 48.

Furthermore, as shown in FIG. 10(c), a protective film 49 of $SiO_2$ is formed on the front surface of the protective film 45 from above the thin film 13 thereby covering the thin film 13 with the protective film 49, and a backside etching window 50 is opened in the protective film 46 at the back surface of the Si substrate 12.

Thereafter, the Si substrate 12 is soaked in the etchant such as TMAH to perform crystal anisotropic etching from the backside etching window 50, thereby forming the through-hole 14 of a truncated pyramid shape at the back surface of the Si substrate 12. The through-hole 14 stops when the etching at the lower surface of the Si substrate 12 reaches the edge of the backside etching window 50.

As shown in FIG. 10(d), the sacrifice layer 44a is exposed to the through-hole 14 when the through-hole 14 reaches the front surface of the Si substrate 12. When the sacrifice layer 44a is exposed, the sacrifice layer 44a is subjected to isotropic etching by the etchant such as TMAH. The isotropic etching starting from the sacrifice layer 44a advances from sacrifice layer 44a→sacrifice layer 44d→sacrifice layer 44b→sacrifice layer 44c as shown with thin line arrows in FIG. 11(a). When the etchant enters the gap of after the sacrifice layers 44a to 44d are etched, the crystal anisotropic etching of the Si substrate 12 advances from the edge portion of gaps 51a to 51d after the sacrifice layers 44a to 44d are removed, as shown with thick line arrows in FIGS. 11(a) and (b) and FIG. 12(a) (FIG. 12(a) shows the front surface of the Si substrate 12), so that etching of the through-hole 14 is also performed from the front side of the Si substrate 12.

As a result, the upper surface of the Si substrate 12 is etched at the region on the inner side than the outer periphery of the sacrifice layer 44c, and the through-hole 14 etched from the front side and the back side forms in the Si substrate 12. The sacrifice layer 44e is removed by etching in this case. The Si substrate 12 is pulled out from the etchant at a point the through-hole 14 is completely formed.

After washing the Si substrate 12, the protective films 45, 49 of $SiO_2$ are removed by etching with HF aqueous solution, and the like, which etching is terminated at a point only the holder 18 formed from the protective film 45 remains at the four corners of the thin film 13, as shown in FIGS. 13(a) and (b), and then washing and drying are performed to complete the vibration sensor 41.

In this embodiment as well, the through-hole 14 of small spreading can be opened at the back side and the vibration sensor 41 can be miniaturized with only the etching from the back side of the Si substrate 12. Furthermore, since the through-hole 14 can be opened through etching of only from the back side, the etching hole does not need to be opened in the thin film 13, and the risk of changing the physical characteristics of the thin film 13 in the vibration sensor 41 or lowering the strength of the thin film 13 is reduced. Moreover, the corrugated structure, the stopper, and the like can be easily formed in the thin film 13 through the same step.

Fourth Embodiment

Figure 14:
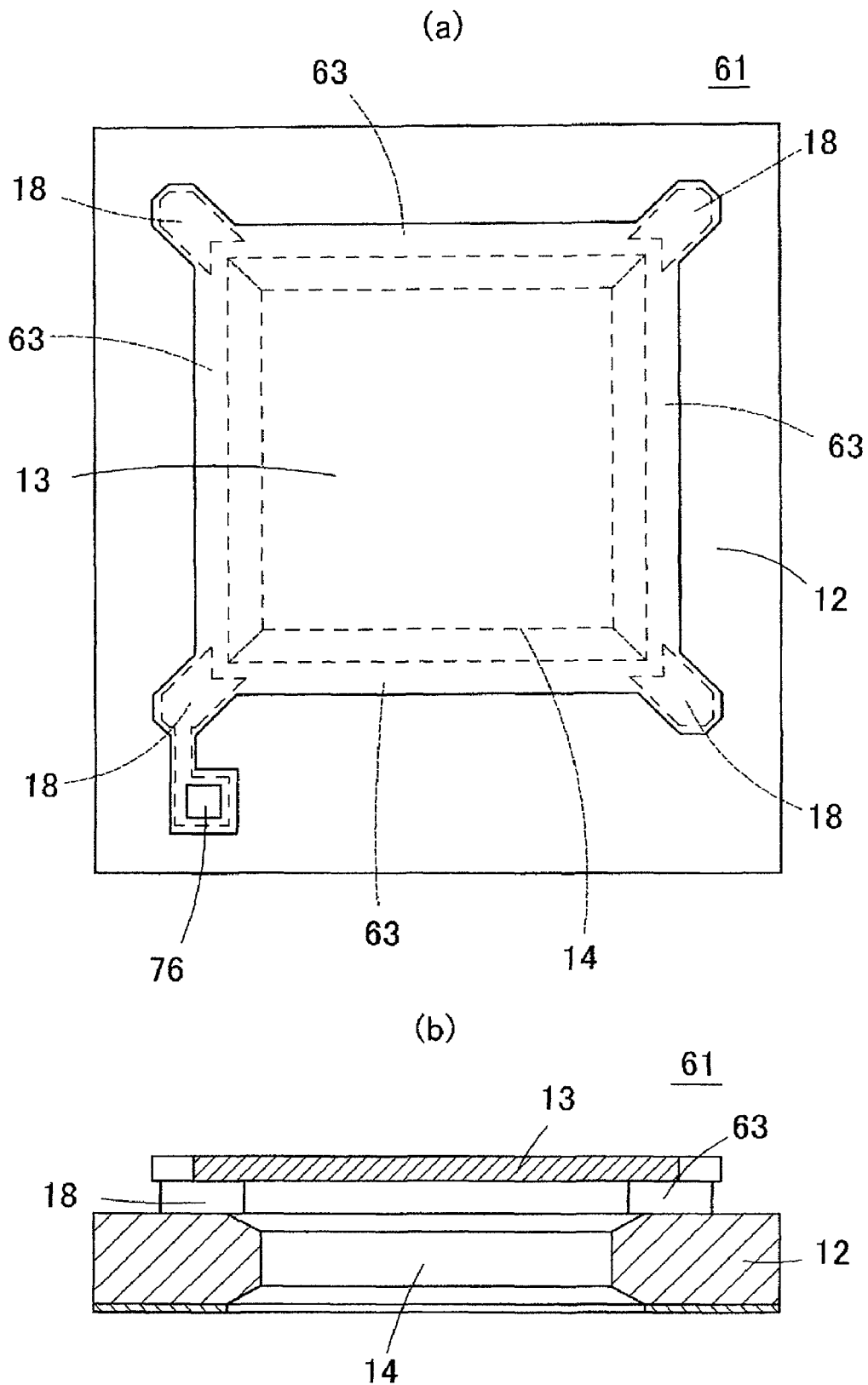
FIG. 14(a) is a plan view showing a structure of a vibration sensor according to a fourth embodiment of the present invention.
FIG. 14(b) is a cross-sectional view thereof.

FIG. 14(a) is a plan view showing a structure of a vibration sensor 61 according to the fourth embodiment of the present invention, and FIG. 14(b) is a cross-sectional view thereof. In the vibration sensor 11 of the first embodiment, the holder 18 is formed over the entire periphery of the lower surface of the thin film 13, but the holder 18 is formed only at the corners (four corners) of the thin film 13 in the vibration sensor 61 of the fourth embodiment. In the vibration sensor 61 of the fourth embodiment, the holder 18 is arranged only at the corners of the thin film 13, and thus the upper side and the lower side of the thin film 13 are communicated through a vent hole 63 between the holders 18 of the thin film 13 at the four sides.

Figure 15:
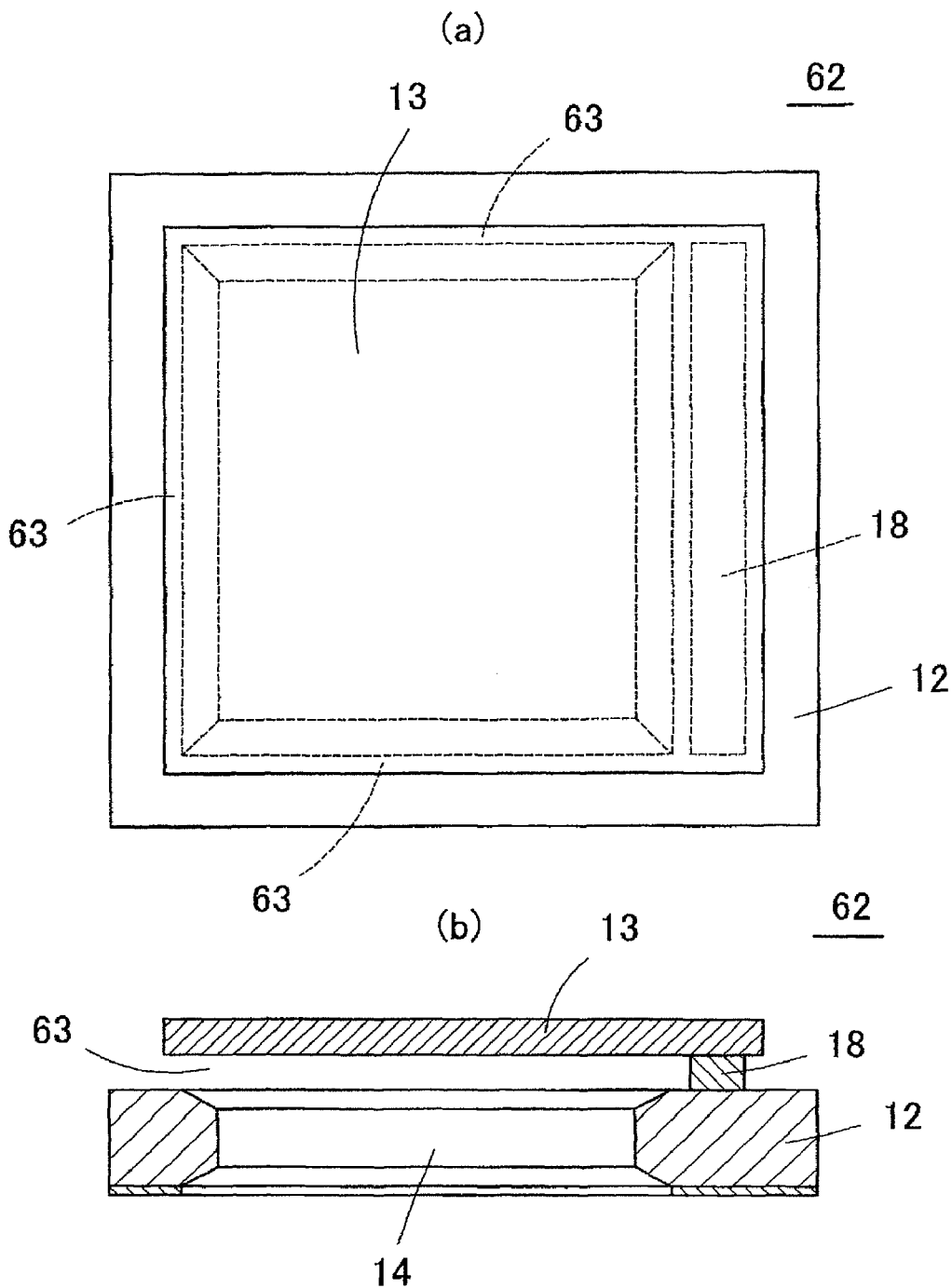
FIG. 15(a) is a plan view showing a structure of another vibration sensor according to the fourth embodiment of the present invention.
FIG. 15(b) is a cross-sectional view thereof.

FIG. 15(a) is a plan view showing a structure of another vibration sensor 62 of the fourth embodiment of the present invention, and FIG. 15(b) is a cross-sectional view thereof. In the vibration sensor 62, the holder 18 is formed only at one side of the thin film 13. In the vibration sensor 62, the thin film 13 is supported in a cantilever form by the holder 18, and thus the upper side and the lower side of the thin film 13 are communicated through the vent holes 63 at the three sides.

In order to partially form the holder 18 as in the vibration sensors 61, 62, the width of the protective film may be widened at the portion to form the holder 18, or the distance (distance from etching starting position to terminating position) from the etchant placing position may be set large to manage the etching time to thereby partially remove the protective film and partially leave the protective film, so that the holder 18 can be formed from the remained protective film. For instance, the holder 18 is formed at a position distant from the center in the vibration sensor 61. In the vibration sensor 62, the width of the protective film at one side is made larger than the width of the protective film at the other three sides so as to remain after etching.

The structures of the vibration sensors 61, 62 are desirable in the application of the microphone (acoustic sensor). In other words, in the vibration sensors 61, 62, the thin film 13 is flexible and is easily elastically deformable since the thin film 13 is fixed only at one portion. Therefore, it is suitable in use as a microphone, and the like, for detecting dynamic pressure difference.

In particular, in a case where the thin film 13 is a rectangle, the thin film 13 becomes a flexible spring when only the four corners of the thin film 13 are fixed as in the vibration sensor 61. Furthermore, according to such a method for fixing only four corners, the majority of the thin film 13 deforms like a parallel plate, and thus the sensitivity of an electrostatic capacity microphone enhances significantly.

The fixed portion at the four corners of the thin film 13 preferably has a shape extended in a diagonal direction so that external stress by deformation does not concentrate. The electrode can be taken out from the thin film 13 without inhibiting the vibration of the thin film 13 by connecting an electrode pad 73 to the extended site.

Furthermore, since the internal stress of the holder 18 influences the vibration characteristics of the thin film 13, the vibration characteristics of the thin film 13 are changed by controlling the internal stress of the holder 18. For instance, if a tensile stress of the thin film 13 is strong, the tensile stress of the thin film 13 is weakened by forming the holder 18 as an oxide film having a compression stress, thereby enhancing the sensitivity.

According to the structures of the vibration sensors 61, 62, ventilation characteristic is provided between the front surface of the Si substrate 12 and the thin film 13, and thus a static pressure difference can be eliminated at both surfaces of the thin film 13, and the function of vent hole can be provided.

In U.S. Pat. No. 5,452,268, for example, the width of the vent hole in a plane direction is set short to enhance the acoustic resistance. However, narrowing the width of the vent hole has limits in terms of process rule, and effects cannot be greatly expected.

The resistance component Rv of the vent hole is expressed by, $$Rv = (8 \cdot \mu \cdot t \cdot a^2)/(Sv)^2 \quad \text{(Eq. 1)}$$

Here, $\mu$ is a friction loss coefficient of the vent hole, t is a length in a ventilation direction of the vent hole, a is an area of the diaphragm, and Sv is a cross-sectional area of the vent hole. A roll-off frequency fL (limiting frequency at which the sensitivity lowers) of the microphone is expressed by, $$1/fL = 2\pi \cdot Rv(Cbc + Csp) \quad \text{(Eq. 2)}$$

Here, Rb is a resistance component of the above equation, Cbc is an acoustic compliance of the through-hole 14, and Csp is a stiffness constant of the thin film 13.

Figure 16:
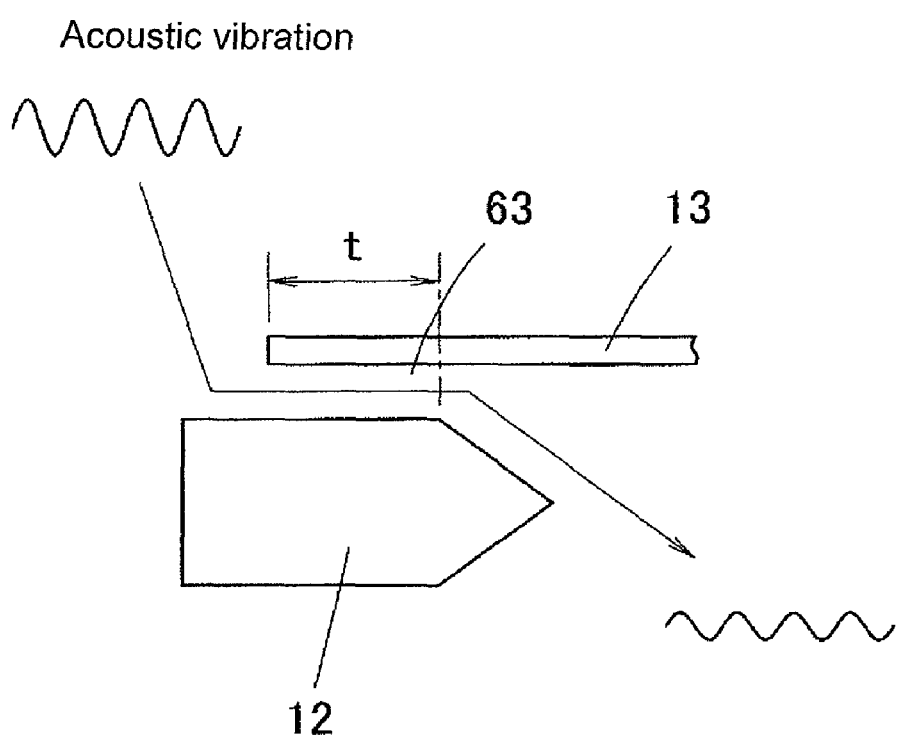
FIG. 16 is a view describing an operation of a vent hole.

As shown in FIG. 16, the length t of the vent hole 63 between the upper surface of the Si substrate 12 and the thin film 13 can be set long in the vibration sensors 61, 62. Therefore, in the vibration sensors 61, 62, the acoustic resistance can be set very high by taking the length t of the vent hole 63 long, as apparent from equation (1), and the low frequency characteristic of the vibration sensors 61, 62 can be improved, as apparent from equation (2), and thus preferable characteristics for the microphone can be obtained.

The acoustic compliance (acoustic compliance of back chamber) Ccav of the through-hole 14 is expressed by, $$Ccav = Vbc/(\rho c^2 \cdot Sbc) \quad \text{(Eq. 3)}$$

Here, Vbc is a volume of the through-hole (back chamber volume), $\rho c^2$ is volume elasticity of air, and Sbc is an opening area of the through-hole 14.

In the vibration sensors 61, 62, the through-hole 14 having a small opening area compared to the volume can be formed by etching from both front and back surfaces of the Si substrate 12, and thus the acoustic compliance of the through-hole 14 can be increased and the sensitivity is prevented from easily lowering even if the vent hole 63 is opened, as apparent from equation (3).

Figure 17:
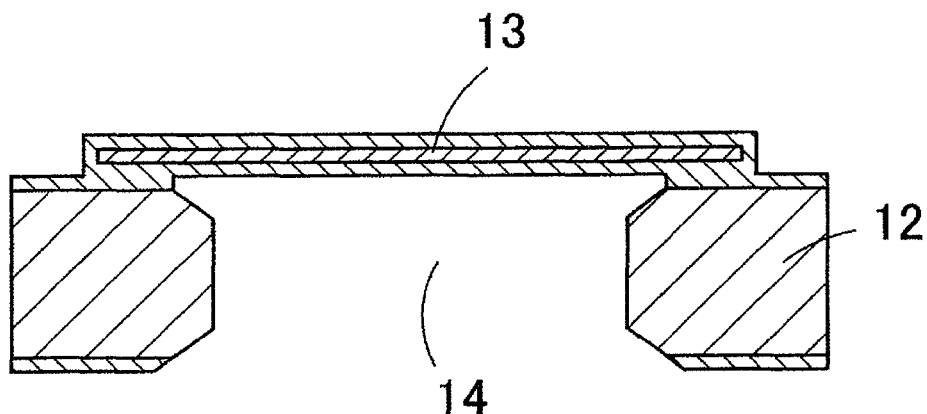
FIGS. 17(a), (b), and (c) are cross-sectional views showing the steps of continuing etching until an inner peripheral surface of a through-hole is recessed.
Figure 17:
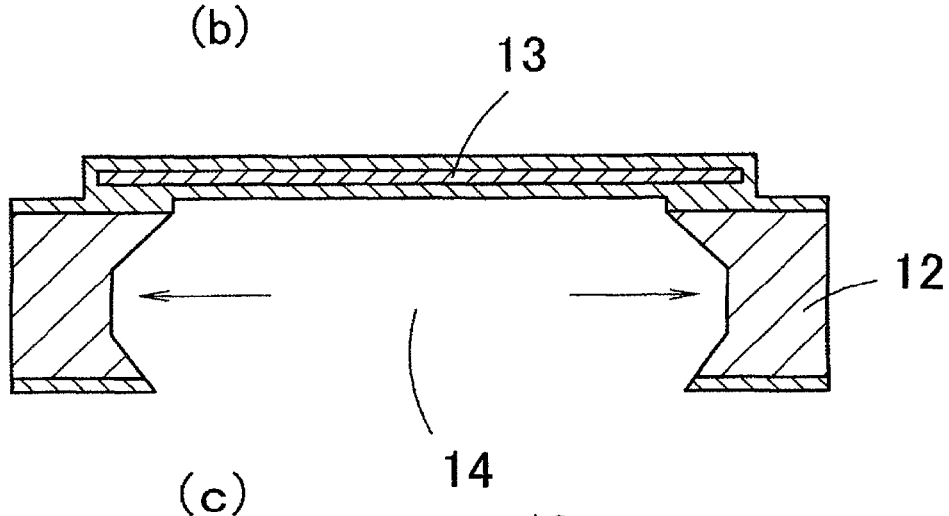
Figure 17:
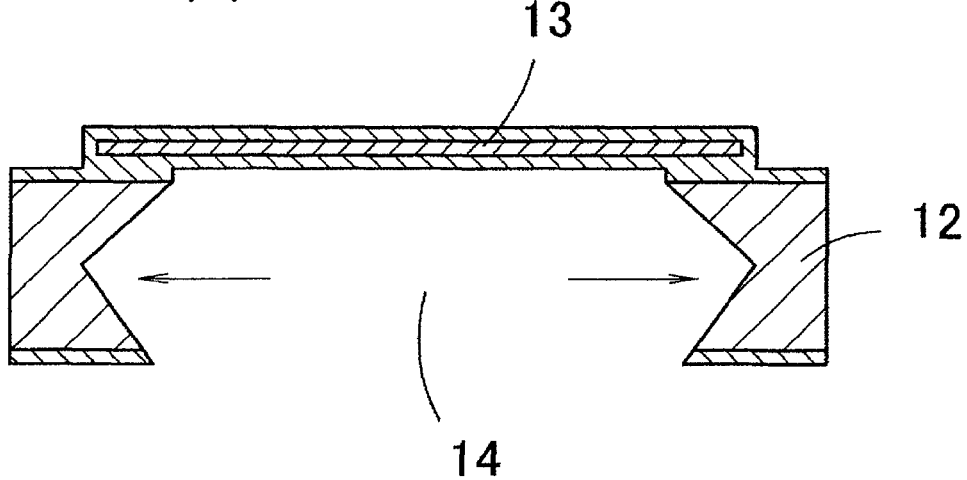

When etching is further continued after the through-hole 14 is subjected to crystal anisotropic etching so that the central part projects to the inner side, as shown in FIG. 17(a), the etching is ultimately advanced to the state of FIG. 17(c) through the state of FIG. 17(b), and the etching of the through-hole 14 is stopped when the (111) plane or the crystal plane equivalent thereto appears. Therefore, the volume of the through-hole 14 becomes larger, and the acoustic compliance Ccav is further increased by etching to the state of FIG. 17(c). Alternatively, the appropriate volume of the through-hole 14 and the size of the vibration sensor can be obtained by controlling the etching time when etching from the state of FIG. 17(a) to the state of FIG. 17(c).

The state of FIG. 17(c) is the final mode of the crystal anisotropic etching, and the shape of the back chamber is determined by the size and the relative position of the opening at the front surface and the back surface. When the final mode is obtained, the shape of the back chamber (through-hole 14) is maintained substantially constant even if the etching time is further extended, and thus process stability is satisfactory and a yield is high.

Figure 18:
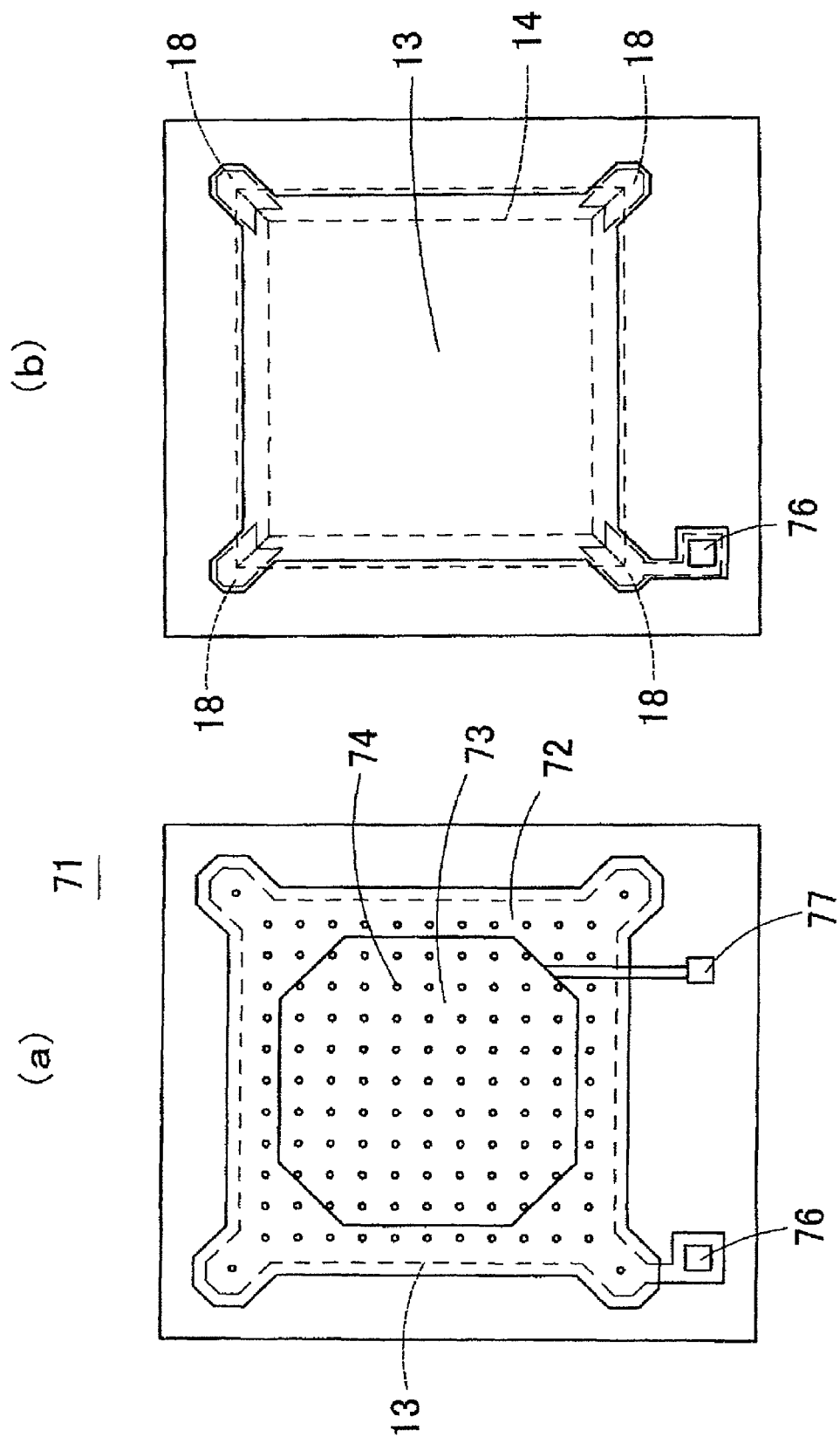
FIG. 18(a) is a plan view of a microphone according to the present invention.
FIG. 18(b) is a plan view of the microphone with a back plate 72 removed.
Figure 19:
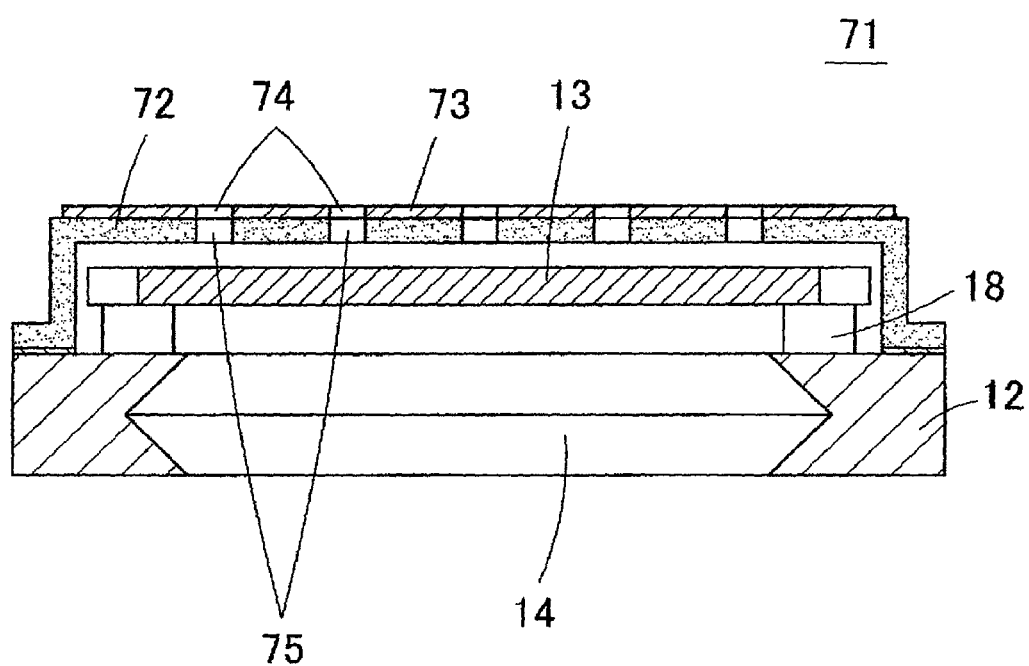
FIG. 19 is a cross-sectional view of the microphone.

The structure of an electrostatic capacity microphone 71 configured using the vibration sensor 61 having the above structure, and the method for manufacturing the same will now be described. FIG. 18(a) is a plan view of the microphone 71, FIG. 18(b) is a plan view of the microphone 71 (i.e., vibration sensor 61) with a back plate 72 removed, and FIG. 19 is a cross-sectional view of the microphone 71. The microphone 71 has the back plate 72 fixed on the vibration sensor 61 so as to cover the thin film 13. The back plate 72 has a cap-shape with a recessed portion at the lower surface, and is fixed on the front surface of the Si substrate 12 so as to accommodate the thin film 13 in the recessed portion. A gap of an extent of not inhibiting the vibration of the thin film 13 forms between the lower surface of the back plate 72 and the thin film 13.

A metal electrode 73 is arranged on the upper surface of the back plate 72. The metal electrode 73 is not arranged on the entire surface of the back plate as shown in FIG. 18, but is arranged at one portion of the back plate 72 and in particular, at the portion facing the portion where the amplitude is relatively large of the thin film 13. This is to reduce the parasitic capacitance, and enhance the characteristic of the electrostatic capacity microphone 71. If the thin film 13 is fixed at four corners as in the present embodiment, the parasitic capacitance can be reduced and the limited region can be effectively utilized by having the shape of the metal electrode 73 to a substantially octagonal shape as shown in FIG. 18(a). A plurality of acoustic holes 74, 75 is opened in the metal electrode 73 and the back plate 72. Therefore, the acoustic vibration from the upper side passes through the acoustic holes 74, 75 of the metal electrode 73 and the back plate 72 and reaches the thin film 13, thereby vibrating the thin film 13. The thin film 13 (movable electrode) of polycrystalline silicon has conductivity, and the electrostatic capacity between the thin film 13 and the metal electrode 73 (fixed electrode) changes when the thin film 13 vibrates, which can be retrieved to the outside as an electric signal through an electrode pad 76 on the thin film 13 side and an electrode pad 77 on the back plate side 72 side, and the acoustic vibration can be detected by detecting such change in electrostatic capacity.

The manufacturing steps of the microphone 71 will be described according to FIGS. 20(a) to (d) and FIGS. 21(a) to (d). As shown in FIG. 20(a), the protective film 20, the sacrifice layer 23, the protective film 24, the thin film 13, and the protective film 25 are sequentially stacked on the front surface of the Si substrate 12, and the protective film 21 is formed on the back surface of the Si substrate 12. This is the same structure as FIG. 3(a) of the first embodiment and is fabricated through the same steps as FIG. 2(a) to FIG. 2(d) of the first embodiment.

Figure 20:
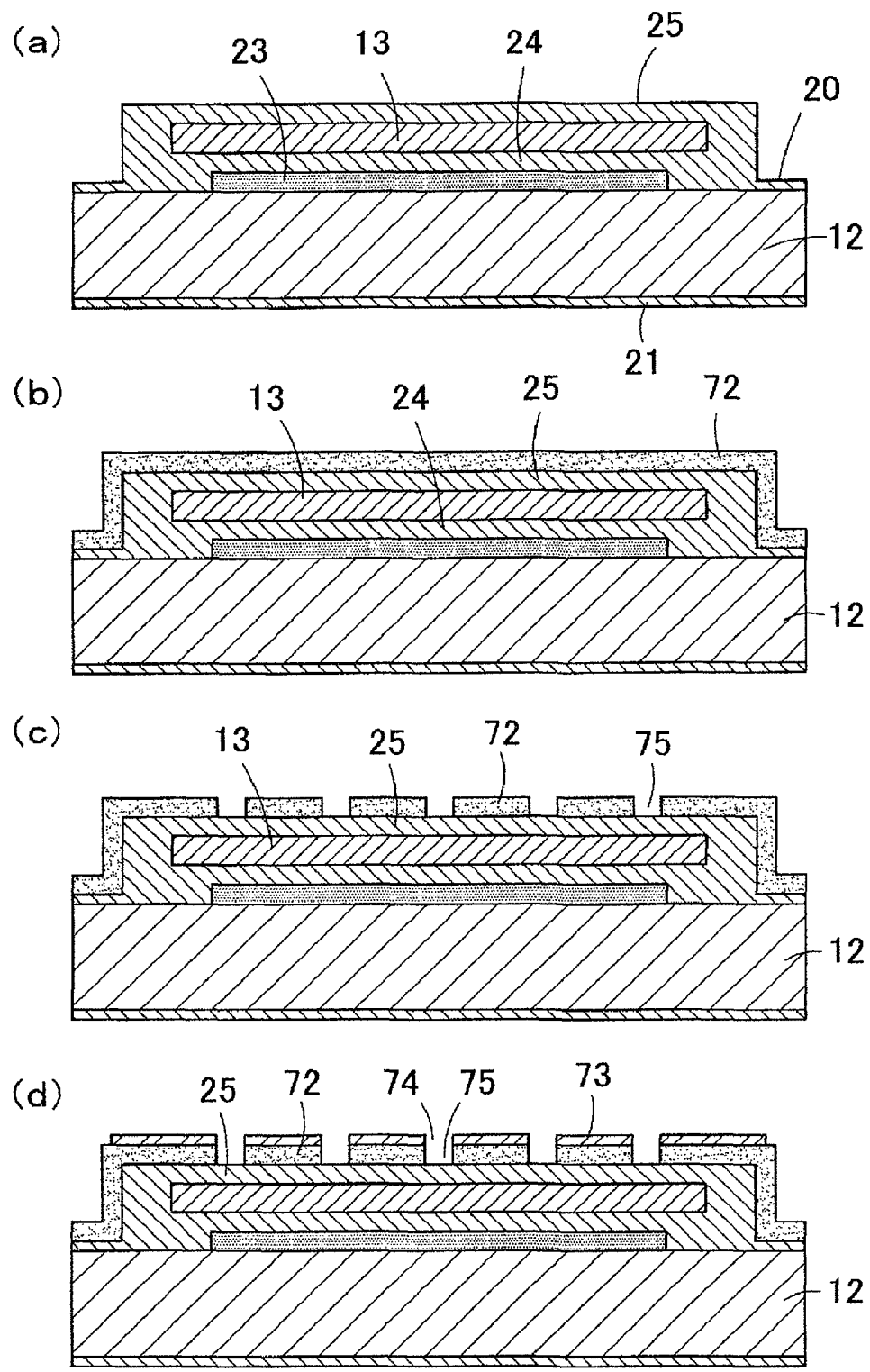
FIGS. 20(a) to (d) are cross-sectional views showing manufacturing steps of the microphone according to the present invention.

As shown in FIG. 20(b), an SiN film is formed from the front surface of the protective film 25 to the outer peripheral surfaces of the protective films 24 and 25, and the back plate 72 is formed by the SiN film. Thereafter, as shown in FIG. 20(c), the acoustic hole 75 is opened in the back plate 72 by etching. In this case, although not shown in FIG. 20, the SiN film at the electrode retrieving portion is also etched. Then, as shown in FIG. 20(d), a Cr film is formed on the front surface of the back plate 72, and Au is formed thereon to thereby obtain an Au/Cr film, and the Au/Cr film is etched to a predetermined shape to fabricate the metal electrode 73 and the electrode pads 76, 77.

The backside etching window 26 is opened in the protective film 21 at the back surface using the photolithography technique. The size of the backside etching window 26 of about 570 μm for one side is sufficient in a case of the (100) plane Si substrate 12 having a thickness of 400 μm. After the backside etching window 26 is opened, the Si substrate 12 is soaked in the etchant such as TMAH to perform crystal anisotropic etching on the Si substrate 12 from the back side, thereby opening the through-hole 14 in the Si substrate 12. This state is shown in FIG. 21(a).

Figure 21:
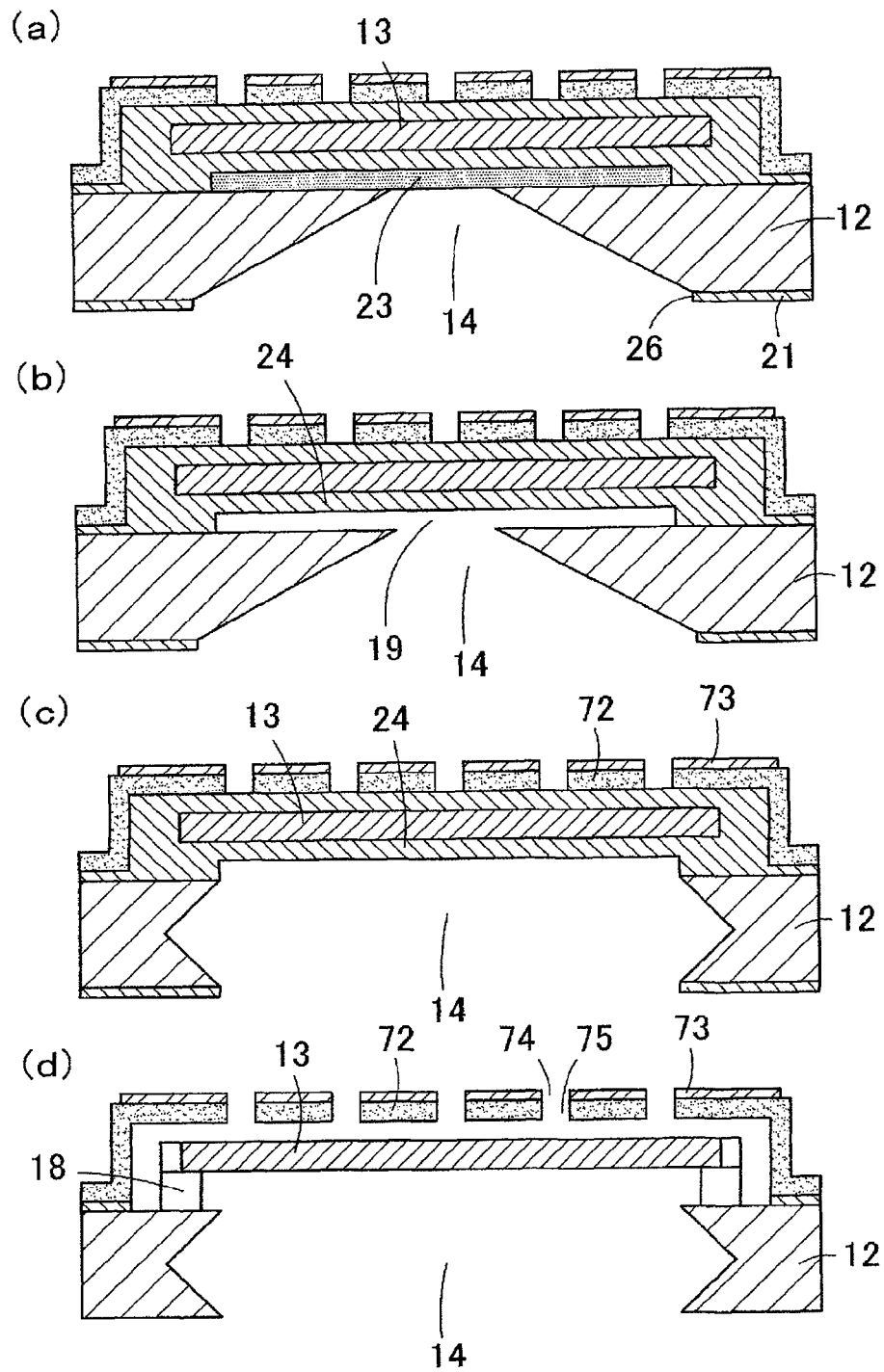
FIGS. 21(a) to (d) are cross-sectional views showing the manufacturing steps of the microphone according to the present invention, following FIG. 20(d).

As shown in FIG. 21(a), when the sacrifice layer 23 is exposed to the interior of the through-hole 14, the polycrystalline silicon sacrifice layer 23 is subjected to isotropic etching by the etchant such as TMAH, and the gap 19 forms at the front surface of the Si substrate 12, as shown in FIG. 21(b). After the gap 19 is formed, the etchant such as TMAH enters the gap 19 thereby etching the Si substrate 12 also from the front side, and the etching advances also in the horizontal direction, whereby the edge of the through-hole 14 has a cross-sectional shape tapered at the front and the back, as shown in FIG. 21(c).

The Si substrate 12 is pulled out from the etchant when the desired shape of the through-hole 14 is obtained. The protective films 21, 24, 25 protecting the thin film 13 are then etched with HF aqueous solution, or the like, and removed leaving the protective film 20 at the lower surface of the back plate 72 and the holder 18. In this case, the protective film 25 is mainly etched with the HF aqueous solution entered from the acoustic holes 74, 75. Therefore, the arrangement interval of the acoustic holes 74, 75 is desirably a substantially equal interval so that etching is uniformly performed, as shown in FIG. 18(a). The etching time can be reduced by reducing the arrangement interval, but the number of acoustic holes 74, 75 increases by such amount, the electrode area reduces, and the sensitivity lowers. Furthermore, the arrangement interval of the acoustic holes is also related to the size of the holder 18. In other words, if the arrangement interval is too large, the etching time becomes long, and all the holders 18 are etched. In view of the above, the interval of the acoustic holes 74, 75 is set to 50 μm. The holder 18 is formed only at the corner of the thin film 13, and the vent hole 63 is opened between the holders 18. The microphone 71 having the structure of FIG. 20(d) is thereby completed.

The through-hole 14 can be etched from both the front side and the back side of the Si substrate 12, an area loss due to the inclined surfaces of the through-hole 14 can be reduced, and the microphone 71 can be miniaturized by fabricating the microphone 71 in the above manner. Furthermore, starting the etching from the back side, the Si substrate 12 can be subjected to crystal anisotropic etching from the front side and the back side to open the through-hole 14 by combining the crystal anisotropic etching and the isotropic etching. Therefore, the through-hole 14 can be opened through simple steps, and both lower cost and high productivity can be achieved. Moreover, since the etching hole does not need to be opened in the thin film 13, the risk of lowering the strength of the thin film 13 or degrading the vibration characteristic is also reduced.

The thin film 13 easily vibrates and the sensitivity of the microphone 71 improves since the thin film 13 is partially supported by the holder 18, and the acoustic resistance of the microphone 71 increases and the low frequency characteristic improves since the long vent hole 63 is formed in the gap between the thin film 13 and the Si substrate 12 between the holders 18. Furthermore, the acoustic compliance can be increased and the characteristic of the microphone 71 can be improved since the volume of the through-hole 14 can be increased.

In each embodiment described above, a case of using the (100) plane Si substrate for the substrate has been described, but (110) plane Si substrate, or the like may also be used.

The invention claimed is:

1. A method for manufacturing a vibration sensor comprising:
    forming a sacrifice layer at one part of a front surface of a semiconductor substrate comprising monocrystalline silicon with a material isotropically etched by an etchant for etching the semiconductor substrate;
    forming a thin film protective film with a material having resistance to the etchant on the sacrifice layer and the front surface of the semiconductor substrate at a periphery of the sacrifice layer;
    forming a thin film of monocrystalline silicon, polycrystalline silicon, or amorphous silicon on an upper side of the sacrifice layer;
    opening a backside etching window in a back surface protective film having resistance to the etchant for etching the semiconductor substrate formed on a back surface of the semiconductor substrate;
    forming a through-hole in the semiconductor substrate by etching the semiconductor substrate anisotropically by using crystal-oriented etching by applying the etchant from the back surface window, then etching the sacrifice layer isotropically by the etchant after the etchant reaches the front surface of the semiconductor substrate, and then etching the semiconductor substrate anisotropically by using crystal-oriented etching from a front side by the etchant spread to a space formed after the sacrifice layer is removed; and
    forming a holder for supporting the thin film on an upper surface of the semiconductor substrate by removing the thin film protective film partially,
    wherein a vent hole for communicating the front side and the back side of the thin film is formed between the holders.

2. The method for manufacturing the vibration sensor according to claim 1, wherein the thin film is a square.

3. The method for manufacturing the vibration sensor according to claim 2, wherein the holder is arranged at four corners of the thin film.

4. The method for manufacturing the vibration sensor according to claim 1, wherein the thin film is bendable by arranging the sacrifice layer at one part of a forming region of the thin film.

5. A method for manufacturing a vibration sensor comprising:
    forming a sacrifice layer at one part of a front surface of a semiconductor substrate comprising monocrystalline silicon with a material isotropically etched by an etchant for etching the semiconductor substrate;

forming a thin film protective film with a material having resistance to the etchant on the sacrifice layer and the front surface of the semiconductor substrate at a periphery of the sacrifice layer;

forming a thin film of monocrystalline silicon, polycrystalline silicon, or amorphous silicon on an upper side of the sacrifice layer;

opening a backside etching window in a back surface protective film having resistance to the etchant for etching the semiconductor substrate formed on a back surface of the semiconductor substrate;

forming a through-hole in the semiconductor substrate by etching the semiconductor substrate anisotropically by using crystal-oriented etching by applying the etchant from the back surface window, then etching the sacrifice layer isotropically by the etchant after the etchant reaches the front surface of the semiconductor substrate, and then etching the semiconductor substrate anisotropically by using crystal-oriented etching from a front side by the etchant spread to a space formed after the sacrifice layer is removed; and forming a holder for supporting the thin film on an upper surface of the semiconductor substrate by removing the thin film protective film partially, wherein a projection is formed on the front surface of the thin film by arranging the sacrifice layer at one part of a forming region of the thin film.

6. The method for manufacturing the vibration sensor according to claim 1, wherein an area of a cross-section parallel to an opening at an interior of the through-hole is larger than an opening area of the front surface of the through-hole.

7. The method for manufacturing the vibration sensor according to claim 1, wherein the sacrifice layer comprises polycrystalline silicon or amorphous silicon.

8. A method for manufacturing a vibration sensor comprising:

forming a sacrifice layer at one part of a front surface of a semiconductor substrate comprising monocrystalline silicon with a material having resistance to a first etchant for etching the semiconductor substrate;

forming a thin film protective film with a material having resistance to the first etchant on the sacrifice layer and the front surface of the semiconductor substrate at a periphery of the sacrifice layer;

forming a thin film of monocrystalline silicon, polycrystalline silicon, or amorphous silicon on an upper side of the sacrifice layer;

opening a backside etching window in a back surface protective film having resistance to the etchant for etching the semiconductor substrate formed on a back surface of the semiconductor substrate;

etching the semiconductor substrate anisotropically by using crystal-oriented etching by applying the first etchant from the back surface window;

etching the sacrifice layer isotropically by applying a second etchant from the back side of the semiconductor substrate after the first etchant reaches the front surface of the semiconductor substrate;

etching the semiconductor substrate anisotropically by using crystal-oriented etching from a front side by again applying the first etchant from the back side of the semiconductor substrate to a space formed after the sacrifice layer is etching-removed; and forming a holder for supporting the thin film on an upper surface of the semiconductor substrate by removing the thin film protective film partially, wherein a vent hole for communicating the front side and the back side of the thin film is formed between the holders.

9. The method for manufacturing the vibration sensor according to claim 1, wherein the thin film is a square.

10. The method for manufacturing the vibration sensor according to claim 9, wherein the holder is arranged at four corners of the thin film.

11. The method for manufacturing the vibration sensor according to claim 1, wherein the thin film is bendable by arranging the sacrifice layer at one part of a forming region of the thin film.

12. A method for manufacturing a vibration sensor comprising:

forming a sacrifice layer at one part of a front surface of a semiconductor substrate comprising monocrystalline silicon with a material having resistance to a first etchant for etching the semiconductor substrate;

forming a thin film protective film with a material having resistance to the first etchant on the sacrifice layer and the front surface of the semiconductor substrate at a periphery of the sacrifice layer, forming a thin film of monocrystalline silicon, polycrystalline silicon, or amorphous silicon on an upper side of the sacrifice layer;

opening a backside etching window in a back surface protective film having resistance to the etchant for etching the semiconductor substrate formed on a back surface of the semiconductor substrate;

etching the semiconductor substrate anisotropically by using crystal-oriented etching by applying the first etchant from the back surface window;

etching the sacrifice layer isotropically by applying a second etchant from the back side of the semiconductor substrate after the first etchant reaches the front surface of the semiconductor substrate;

etching the semiconductor substrate anisotropically by using crystal-oriented etching from a front side by again applying the first etchant from the back side of the semiconductor substrate to a space formed after the sacrifice layer is etching-removed; and forming a holder for supporting the thin film on an upper surface of the semiconductor substrate by removing the thin film protective film partially, wherein a projection is formed on the front surface of the thin film by arranging the sacrifice layer at one part of a forming region of the thin film.

13. The method for manufacturing the vibration sensor according to claim 1, wherein an area of a cross-section parallel to an opening at an interior of the through-hole is larger than an opening area of the front surface of the through-hole.

* * * * *